United States Patent
Kuo et al.

(10) Patent No.: US 11,366,153 B2
(45) Date of Patent: Jun. 21, 2022

(54) MICRO LED DISPLAY PANEL

(71) Applicants: KKT Holdings Syndicate, Dover, DE (US); Chiyan Kuan, Danville, CA (US)

(72) Inventors: Tzu-Yi Kuo, Taipei (TW); Cheng Ta Kao, Taipei (TW); Chiyan Kuan, Danville, CA (US); Yu-Kuang Tseng, Taipei (TW)

(73) Assignees: KKT HOLDINGS SYNDICATE, Dover, DE (US); Chiyan Kuan, Danville, CA (US)

(*) Notice: Subject to any disclaimer, the term of this patent is extended or adjusted under 35 U.S.C. 154(b) by 89 days.

(21) Appl. No.: 16/743,496

(22) Filed: Jan. 15, 2020

(65) Prior Publication Data
US 2020/0225277 A1 Jul. 16, 2020

Related U.S. Application Data

(60) Provisional application No. 62/792,426, filed on Jan. 15, 2019.

(51) Int. Cl.
- H01L 27/12 (2006.01)
- G01R 31/26 (2020.01)
- H01L 21/683 (2006.01)
- H01L 21/66 (2006.01)
- H01L 25/075 (2006.01)
- H01L 33/62 (2010.01)

(Continued)

(52) U.S. Cl.
CPC ..... *G01R 31/2635* (2013.01); *G01R 1/07314* (2013.01); *H01L 21/6836* (2013.01); *H01L 22/12* (2013.01); *H01L 25/0753* (2013.01); *H01L 27/1214* (2013.01); *H01L 33/0093* (2020.05); *H01L 33/62* (2013.01); *H01L 2221/68354* (2013.01); *H01L 2221/68363* (2013.01); *H01L 2933/0066* (2013.01)

(58) Field of Classification Search
CPC . H01L 21/683; H01L 21/6836; H01L 25/075; H01L 25/0753; H01L 33/00; H01L 33/62; H01L 33/0079; H01L 22/12; H01L 25/16; H01L 25/167; H01L 33/648; H01L 33/0093; H01L 27/15; H01L 27/156; H01L 2933/00; H01L 2933/0066; H01L 2933/0091; H01L 2221/68354; H01L 2221/68363; H01L 2221/68336; H01L 2221/68368; G01R 31/26; G01R 31/2635; G01R 1/073; G01R 1/07314
USPC .......................................................... 257/89
See application file for complete search history.

(56) References Cited

U.S. PATENT DOCUMENTS

| | | | |
|---|---|---|---|
| 2010/0044674 A1* | 2/2010 | Kim | H01L 33/04 257/13 |
| 2011/0248836 A1* | 10/2011 | Brandes | H01L 25/167 340/332 |
| 2014/0354286 A1* | 12/2014 | Kim | G09G 3/3225 324/414 |

* cited by examiner

Primary Examiner — Chuong A Luu
(74) Attorney, Agent, or Firm — WPAT, PC

(57) ABSTRACT

An epitaxial LED wafer is provided and chip process is processed such that each LED chip on the epitaxial wafer can be probed by an array of probe pin and results can be stored in a database. The epitaxial wafer is then diced on an expandable tape, and a display substrate is provided with driving circuits. The tape is expanded such that a pitch of LED chips on the tape is equal to a pitch of LED chips on display substrate. An array of drop pins will collectively and selectively drop LED chips, from the tape to the display substrate, with the same specification according to the probed results in the database.

8 Claims, 26 Drawing Sheets

(51) Int. Cl.
*G01R 1/073* (2006.01)
*H01L 33/00* (2010.01)

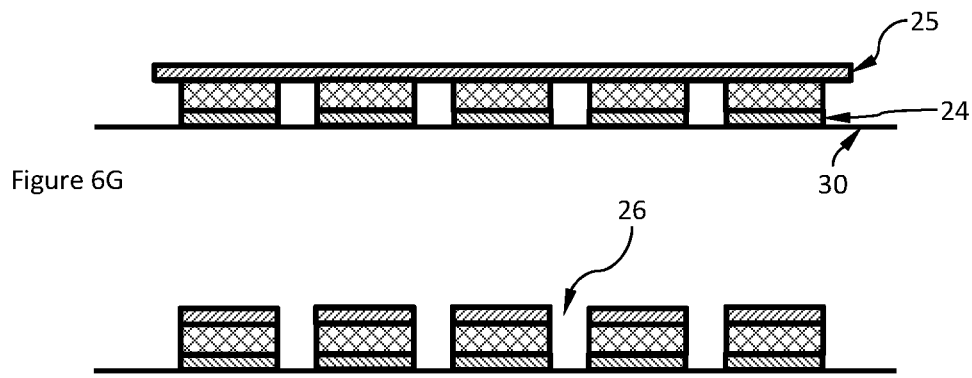
Figure 6G
Figure 6H
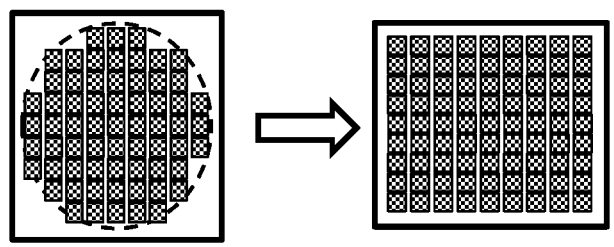
Figure 6I
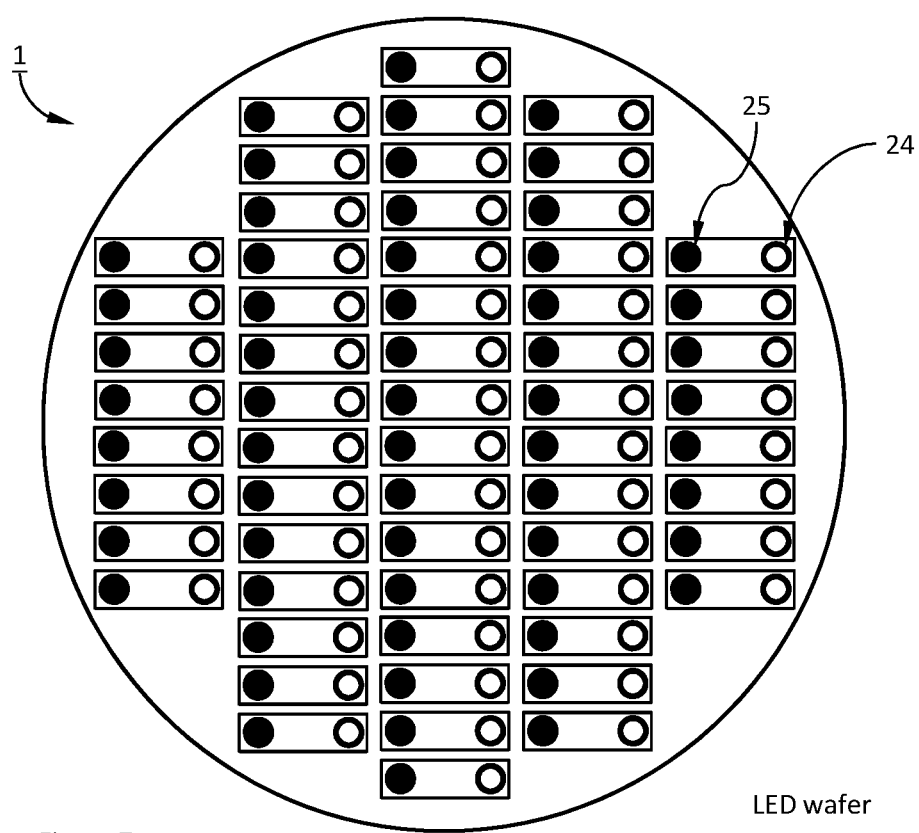
Figure 7

MICRO LED DISPLAY PANEL

CLAIM OF PRIORITY

This application claims the benefit of priority of U.S. provisional application No. 62/792,426 filed Jan. 15, 2019 and entitled "Micro LED Display Panel", the entire disclosures of which are incorporated herein by reference.

FIELD OF THE INVENTION

The invention relates to a micro LED display panel, and more particular to a method and system for manufacturing the micro LED display panel. However, it would be recognized that the invention has a much broader range of applicability.

BACKGROUND OF THE INVENTION

The following description and examples are not admitted to be prior art by virtue of their inclusion in this section.

Current mainstream planar display includes LCD and OLED. Intensity of LCD, due to backlight filtering, is lower than those self-illumination display and black is not dark enough. Further, integrated thickness is not still enough for compact mobile display device. Although self-illumination feature and color rendering index (CRI) of OLED are superior to LCD, life of the OLED is limited within three years according to organic materials. Other disadvantages of OLED include OLED screens are worse compared to LCD when subject to direct sunlight; overall luminance degradation; PWM low frequency modulation will damage to human eyes; and screen burn-in will appear when some pixels are operated too long.

One solution is provided that LED is used as active illumination device instead of backlight for LCD. However, for HD display with high resolution, traditional LED chip size (14 mil×14 mil) is too large for each pixel. Thus, micro LED is thus provided with dimension down to 30 um×30 um, even 5 um×5 um. Micro LED display will include all advantages of OLED while avoiding all disadvantages of OLED.

Two major issues are incurred accordingly. The first is probe/sorting and the second is mass transferring each LED chip into display panel. The former is relative to yield while the both relative to throughput. The present invention provides a solution to solve the above issues.

BRIEF SUMMARY OF THE INVENTION

Accordingly, the invention provides an apparatus for probing a plurality of LED chips, which comprises an array of probing pins for electrically contacting each electrode of the plurality of LED chips, a driving circuit for providing currents to the plurality of the LED chips in sequence, and a database to record forward voltages of the plurality of LED chips with corresponded coordinates in sequence.

In the present invention, each of the plurality of LED chips has a p electrode on one side and an n electrode on the other side.

In the present invention, the apparatus further comprises a sensor to register intensities and wavelengths of the plurality of LED chips with the corresponding coordinates into the database.

The invention therefore provides an apparatus for transferring a plurality of LED chips to a bonding substrate, which comprises an apparatus for probing the plurality of LED chips, means for expanding a tape with the plurality of LED chips thereon, such that distances among the plurality of LED chips substantially equally to distances among bonding pads on the bonding substrate, and means for simultaneously hitting the plurality of LED chips, from the tape to the bonding substrate, according to determined forward voltages, intensities, and wavelengths of the database.

In the present invention, each of the plurality of LED chips has a p electrode and an n electrode on the same side.

In the present invention, the apparatus further comprises a sensor to register intensities and wavelengths of the plurality of LED chips with the corresponding coordinates into the database.

The invention therefore provides an apparatus for transferring a plurality of LED chips to a bonding substrate, which comprises an apparatus for probing the plurality of LED chips, means for expanding a tape with the plurality of LED chips thereon, such that distances among the plurality of LED chips substantially equally to distances among bonding pads on the bonding substrate, and means for simultaneously hitting the plurality of LED chips, from the tape to the bonding substrate, according to determined forward voltages, intensities, and wavelengths of the database.

The invention therefore provides an apparatus for transferring a plurality of LED chips to a bonding substrate, which comprises an apparatus for probing the plurality of LED chips, means for expanding a tape with the plurality of LED chips thereon, such that distances among the plurality of LED chips substantially equally to distances among bonding pads on the bonding substrate, and means for simultaneously hitting the plurality of LED chips, from the tape to the bonding substrate, according to determined forward voltages of the database.

The invention therefore provides an apparatus for transferring a plurality of LED chips to a bonding substrate, which comprises an apparatus for probing the plurality of LED chips, means for expanding a tape with the plurality of LED chips thereon, such that distances among the plurality of LED chips substantially equally to distances among bonding pads on the bonding substrate, and means for simultaneously hitting the plurality of LED chips, from the tape to the bonding substrate, according to determined forward voltages of the database.

The invention therefore provides a method for transferring a plurality of LED chips to a bonding substrate, which comprises steps of providing a tape with the plurality of LED chips thereon by using a chip process, expanding the tape such that distances among the plurality of LED chips substantially equally to distances among bonding pads on the bonding substrate, and transferring the plurality of LED chips to the bonding pads simultaneously.

In the present invention, the method further comprises a step of probing the plurality of LED chips before said transferring step.

In the present invention, the plurality of LED chips is probed forward voltage, intensity, wavelength, and corresponded coordinates.

In the present invention, the plurality of LED chips is probed forward voltage and corresponded coordinates.

In the present invention, the transferred LED chips have the same specification according to the probing step.

In the present invention, each of the plurality of LED chips has a p electrode on one side and an n electrode on the other side.

In the present invention, each of the plurality of LED chips has a p electrode and an n electrode on the same side.

The invention therefore provides a method for transferring a plurality of LED chips to a bonding substrate, which comprises steps of providing an epi-substrate with the plurality of LED chips thereon by using a chip process, each of the plurality of LED chips including a p electrode on one side, probing the plurality of LED chips to register forward voltages of the plurality of LED chips with corresponding coordinates to a database, and in sequence transferring each of the plurality of LED chips, with determined forward voltages according to the database, by using a Laser lift-off process.

In the present invention, the method further comprises a step of forming a plurality of n electrodes on the corresponding plurality of LED chips.

The invention also provides a display panel including an array of pixels, in which one pixel of the array of pixels comprises a substrate, a transistor on said substrate for determining intensity of the pixel, a scanning line on said substrate electrically connecting to a gate of the transistor, a signal line on said substrate electrically connecting to a source of the transistor, and a LED chip including a p electrode on one side and an n electrode on the other side, wherein the p electrode electrically connects to and on the drain of the transistor, and the n electrode is grounded.

In the present invention, the substrate is sapphire.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIG. 6A to FIG. 6I illustrate cross sectional views of another LED chip process;

FIG. 7 illustrates LED chips on a wafer;

Figure 1:
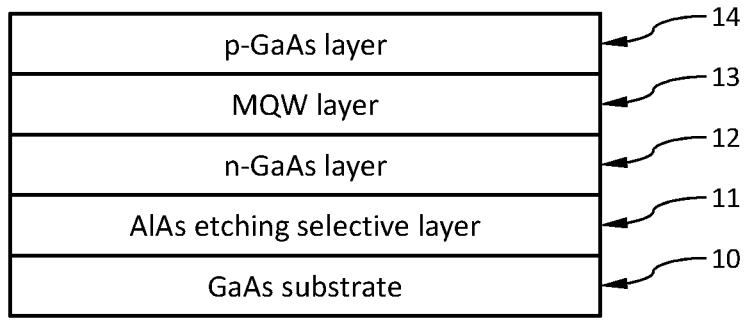
FIG. 1 illustrates a cross sectional view of a conventional GaAs LED structure.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The present invention relates to a probe method and mass transfer of light emitting diode chips, and a display panel using the light emitting diode as a light source. The content of this patent specification is to enable those skilled in the art to understand, manufacture, and use the present invention, so those skilled in the art can easily derive various changes or modifications based on the principles or embodiments disclosed in this patent specification. Therefore, the scope of the present invention is not limited to the embodiments described in this patent specification, but encompasses all technologies conforming to the principles or characteristics of the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

Turning now to the drawings, it is noted that the figures are not drawn to scale. In particular, the scale of some of the elements of the figures is greatly exaggerated to emphasize characteristics of the elements. It is also noted that the figures are not drawn to tie same scale. Elements shown in more than one figure that may be similarly configured have been indicated using the same reference numerals.

The visible light emitted by general light-emitting diodes is mainly arsenide, phosphide, and nitride. When a light emitting diode is applied to a display panel, three primary colors of red, green, and blue are required. Among them, arsenide and phosphide mainly emit red light, and nitride mainly emits green light and blue light.

Please refer to FIG. 1, which is a schematic diagram of the structure of a general gallium arsenide light-emitting diode. First, an epi-substrate 10 is provided, which is a gallium arsenide substrate in this embodiment. Then, an aluminum arsenide etching selective layer 11, an n-type gallium arsenide layer 12, a gallium arsenide multiple quantum well layer 13, and a p-type gallium arsenide layer 14 are sequentially formed by using epitaxial process. If phosphide is applied, the aluminum arsenide etching selective layer 11, the n-type gallium phosphide layer 12, the gallium phosphide multiple quantum well layer 13, and the p-type gallium phosphide layer 14 can be epitaxially growth on the gallium arsenide substrate or the indium phosphide substrate. In the present invention, arsenide is mainly used as an embodiment for forming a red light emitting diode.

Figure 2:
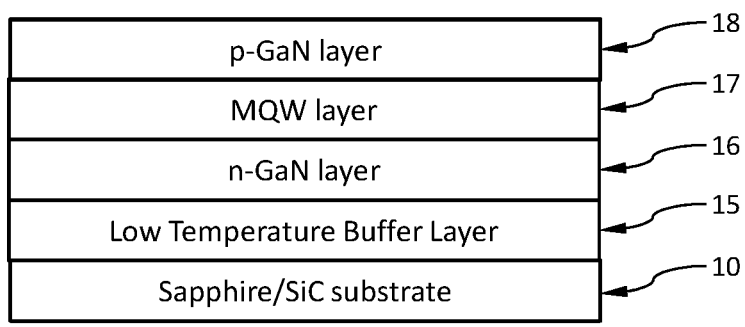
FIG. 2 illustrates a cross sectional view of a conventional GaN LED structure.

Please refer to FIG. 2, which is a schematic structural diagram of a general gallium nitride light emitting diode. The nitride epi-substrate 10 is mainly a sapphire substrate or a silicon carbide substrate. Then, a low-temperature buffer layer 15, an n-type GaN layer 16, a gallium nitride multiple quantum well layer 17, and a p-type GaN layer 18 are sequentially epitaxially formed on the epi-substrate 10. The above epitaxial processes are all traditional epitaxial processes, and the frequency of light emission is determined by the concentration of the compound in the multiple quantum well layer.

Figure 3A:
FIG. 3A to FIG. 3C illustrate cross sectional views of conventional chip process.
Figure 3B:
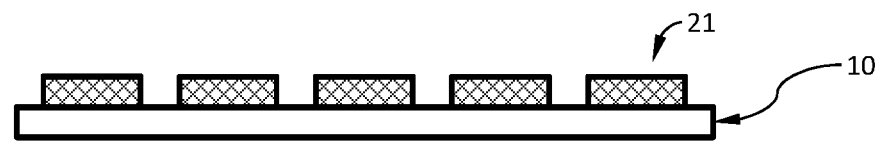
Figure 3C:
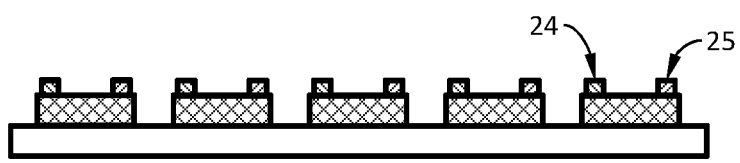
Figure 4:
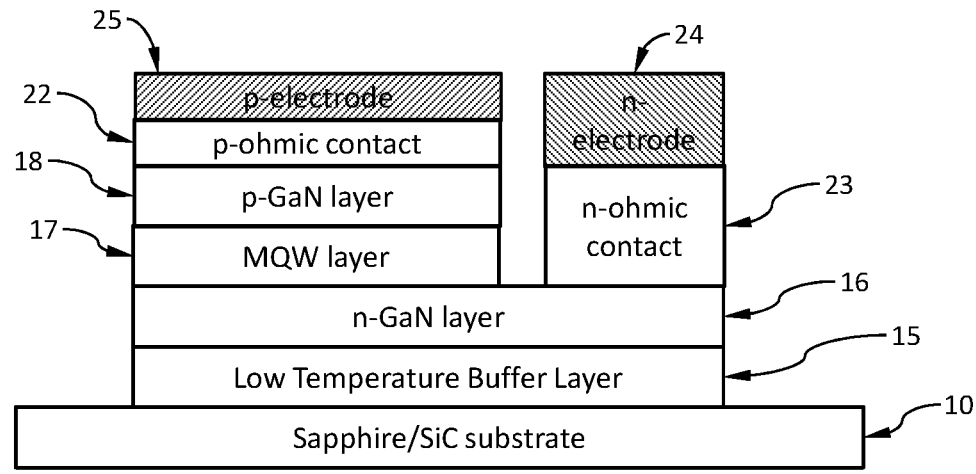
FIG. 4 illustrates a cross sectional view of detailed LED chip structure.
Figure 5A:
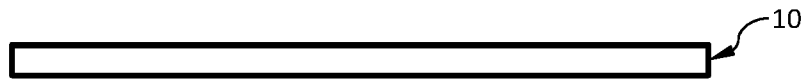
FIG. 5A to FIG. 5H illustrate cross sectional views of detailed LED chip process.
Figure 5B:
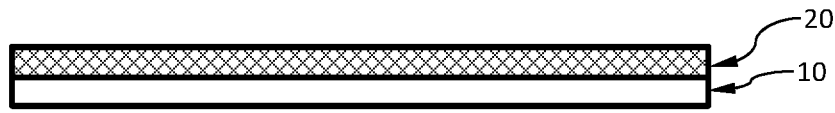
Figure 5C:
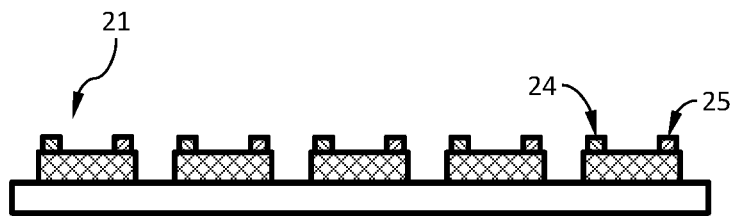
Figure 5D:
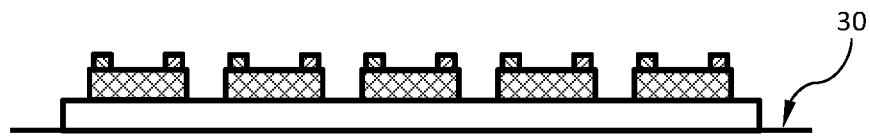
Figure 5E:
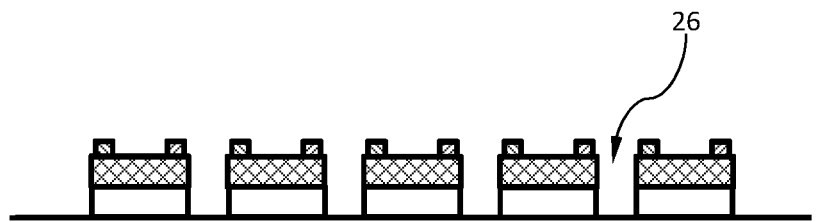
Figure 5F:
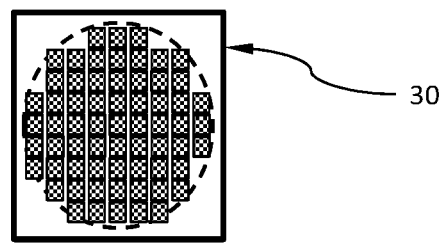
Figure 5G:
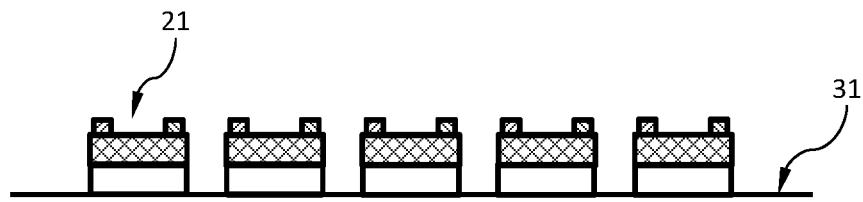
Figure 5H:
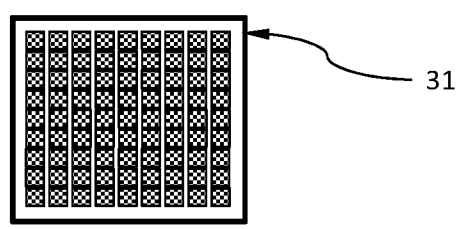
Figure 6A:
Figure 6B:
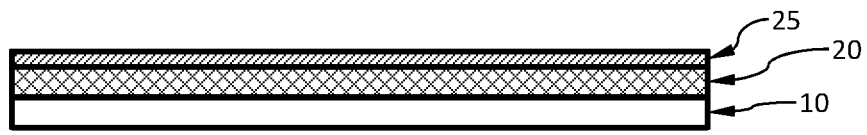
Figure 6C:
Figure 6D:
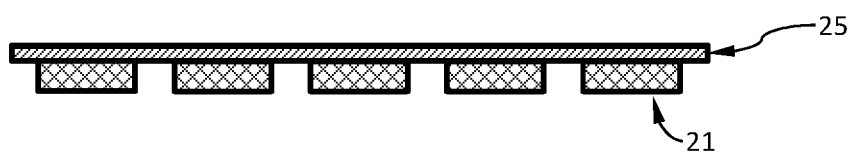
Figure 6E:
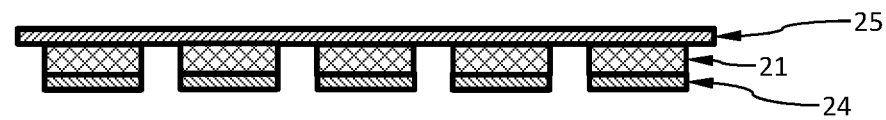
Figure 6F:
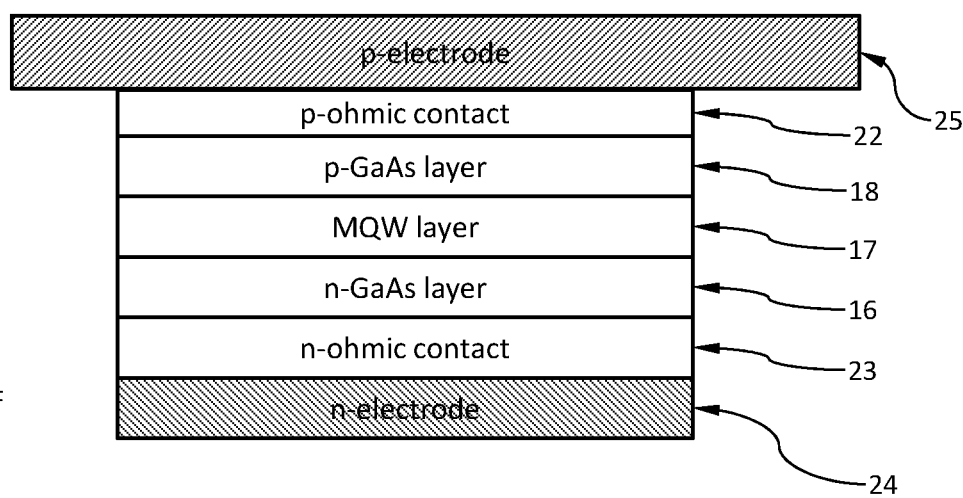

The substrates of gallium arsenide or indium phosphide are both conductive, so the two electrodes of this type of light emitting diode are often double-sided electrodes. However, the first commercially available substrate is sapphire, which is a non-conductive substrate, so the two electrodes of a nitride light-emitting diode can only be made on the same side, which is the so-called coplanar electrode. Please refer to FIG. 3, which shows the process of chip process after gallium nitride epitaxy. Referring to FIG. 3A, a gallium nitride light emitting diode epitaxial layer 20 is sequentially formed on an epi-substrate 10. The light emitting diode epitaxial layer 20 here includes an n-type gallium nitride layer, multiple quantum well layer, and a p-type gallium nitride layer. Referring to FIG. 3B, the epitaxial layer 20 is formed into a plurality of chips 21 of the light emitting diode. A possible method may be an etching method. After that, referring to FIG. 3C, an n electrode 24 and a p electrode 25 are formed on the chip 21 of each light emitting diode. The detailed structure can be referred to the FIG. 4. On the sapphire substrate 10, there are a low-temperature buffer layer 15, an n-type gallium nitride layer 16, a gallium nitride multiple quantum well layer 17, and a p-type gallium nitride layer 18. After a part of the gallium nitride multiple quantum well layer 17 and the p-type gallium nitride layer 18 are etched, an n-type ohmic contact layer 23 is sequentially formed on the exposed n-type gallium nitride layer 16, and then the n-type ohmic layer is formed. An n-electrode 24 is formed on the contact layer. A p-type ohmic contact layer 22 is sequentially formed on the p-type gallium nitride layer, and a p-electrode 25 is formed on the p-type ohmic contact layer 22.

The FIG. 5 shows the process of die dicedting. Referring to FIG. 5A, an epi-substrate 10 is first provided, and then a light emitting diode epitaxial layer 20 is formed on the epi-substrate 10 as shown in FIG. 5B. After the chip process, the light emitting diode epitaxial layer 20 is divided into a plurality of chips 21 and an n electrode 24 and a p electrode 25 are formed on each chip 21, as shown in the FIG. 5C. After that, referring to FIG. 5D, a tape 30 is attached under the epi-substrate 10 and the epi-substrate 10 is diced, such as the scribe line 26 in FIG. 5E. Thereafter, the tape 30 is expanded to separate each individual light emitting diode chip, as shown in FIG. 5F. After that, probe and classification of each light-emitting diode according to wavelength, intensity, and forward voltage are shown in FIG. 5G. In FIG. 5G, although it looks the same as FIG. 5E, each light-emitting diode chip in FIG. 5G has the same specification. After sorting, it is shown in FIG. 5H.

Another type of gallium arsenide light emitting diode manufacturing process is to remove the gallium arsenide substrate 10, as shown in FIGS. 6. Referring to FIG. 6A, first, a gallium arsenide epitaxial layer 20 is sequentially formed on the gallium arsenide epi-substrate 10. Then, a thick metal layer is formed on the epitaxial layer 20 and can be used as the subsequent p-electrode layer 25 at the same time. At this time, the etching selection layer is removed by etching so that the gallium arsenide substrate 10 is separated from the epitaxial layer 20, as shown in FIG. 6C. After that, the epitaxial layer 20 is divided into individual light-emitting diode chips 21 as shown in FIG. 6D. After that, an n-electrode 24 is formed on the other surface of the epitaxial layer 20. Please refer to FIG. 6F for detailed structure. This structure exists because the gallium arsenide substrate absorbs light, so removing the gallium arsenide substrate by etching the aluminum arsenide layer can increase the intensity even more. After that, the tape 30 is attached to the n electrode 24 as shown in FIG. 6G. The p-electrode layer 25 is diced as shown in FIG. 6H. After probing and sorting, it becomes a light-emitting diode of the same specification, as shown in FIG. 6I.

From the above description, it can be known that the structure of the light emitting diode has different materials and different electrodes. If it is to be applied to the panel of the display, it will have different specifications and different operating modes. Current light-emitting diodes, if viewed from the most traditional two-inch wafers, can diced nearly 18,000 die with a standard size of 14 mil×14 mil. However, when entering a micro-light emitting diode, that is, the smallest size can reach 5 um×5 um, it is possible to diced 1.6 million chips from a two-inch wafer. At this time, several problems will occur. The first is that the time for probe and sorting is too long, and the other is how to sequentially transfer the 1.6 million die to the display panel. If the display panel is larger than two inches, this transfer process will be more time consuming. Therefore, on the micro-luminescent diode display panel, the above two problems exist.

The present invention first provides a probing method. First, after all the light-emitting diodes are just divided on the epi-substrate and electrodes are formed, directly contact a large number of light-emitting diode chips directly with the array of probes. Then each of the light-emitting diode chips is sequentially measured through the driving circuit, and the intensity, wavelength, and forward voltage are recorded.

And the value of each position is recorded in the database. Afterwards, the same sorted light-emitting diodes can be selectively bonded to the display panel through the database. Among them, the expansion of the tape can be made so that the distance between each light emitting diode is the same as the distance between the bonding pads on the display panel. At this time, most of the light emitting diodes can be transferred to the display panel at a time. This solves the problems of probe, sorting, and massive transfer at the same time.

Figure 8A:
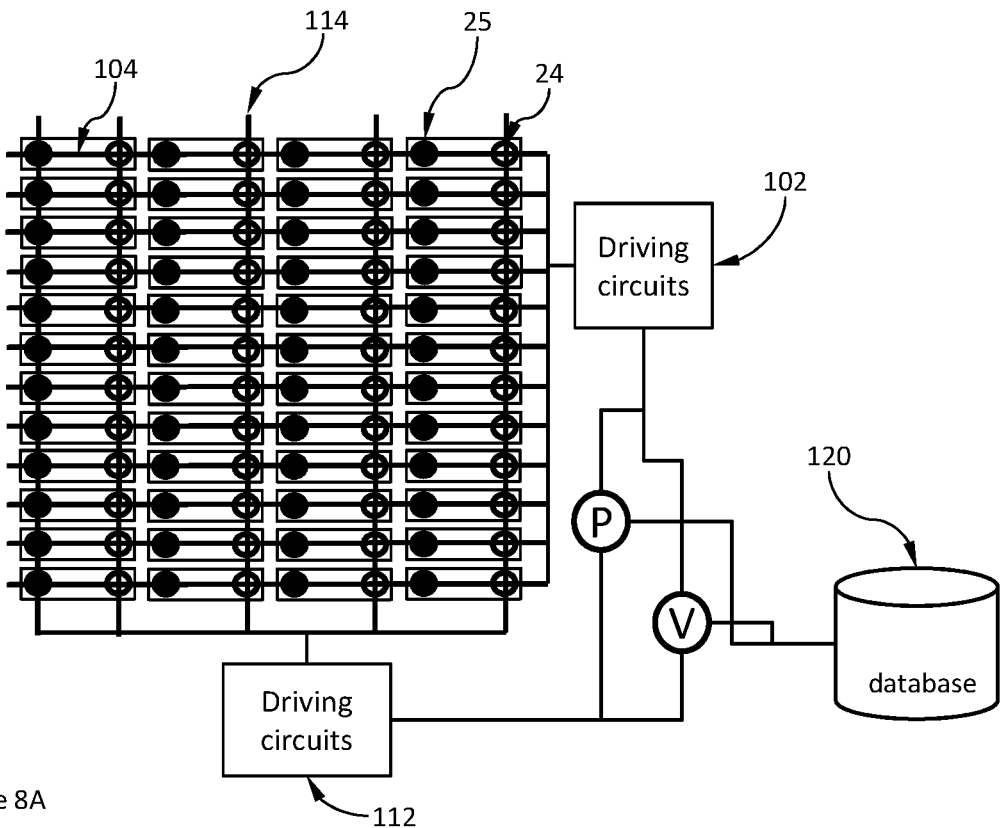
FIG. 8A and FIG. 8B illustrate an apparatus for probing LED chips in accordance with one embodiment of the present invention.
Figure 8B:
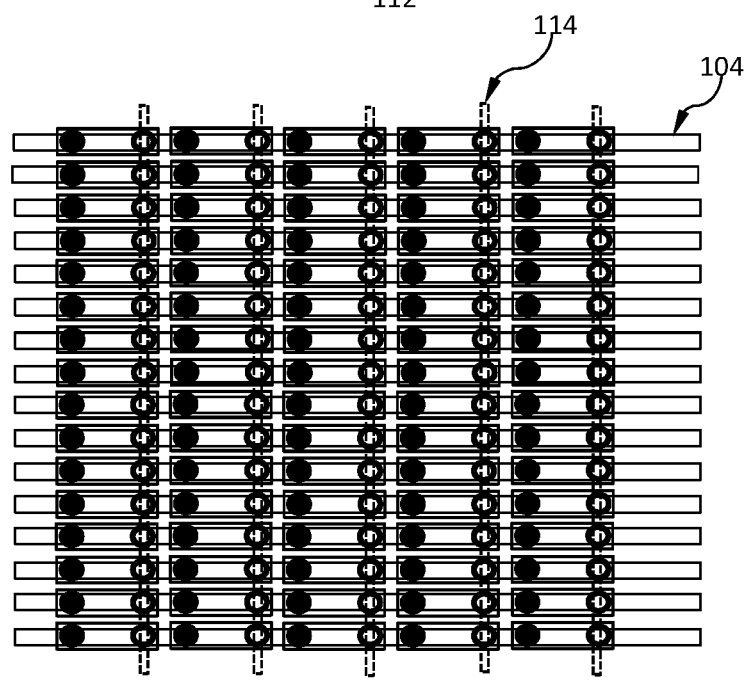

Referring to FIG. 7, the light emitting diode wafer 1 has a plurality of light emitting diode chips. In this embodiment, it is a type of coplanar electrodes, so the n electrode 24 and the p electrode 25 can be seen. In the method of the present invention, as shown in FIG. 8A, the n-electrode 24 of each light-emitting diode is electrically connected to the negative line 114 and the p-electrode 25 of each light-emitting diode is electrically connected to the positive line 104. The negative line 114 is all connected to the driving circuit 112 and the positive line 104 is all connected to the driving circuit 102. The power source P is connected to the driving circuit 102 and the other driving circuit 112, respectively, and is configured to provide a current required by each light emitting diode. The voltmeter V is used to record the forward voltage when a certain light-emitting diode chip is lit, and the result is transmitted to the database 120. FIG. 8B shows a top view of the actual positive electrode line 104 and the secondary electrode line 114 at each light emitting diode.

Figure 9A:
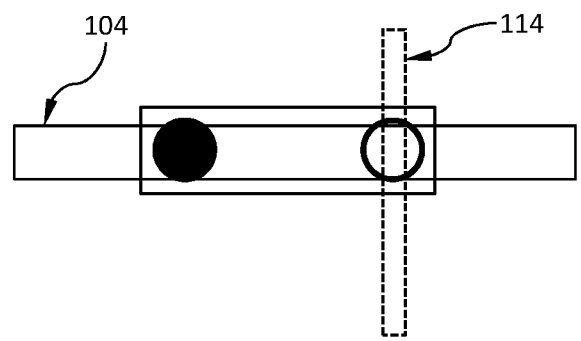
FIG. 9A to FIG. 9E illustrate probe pin and sensors in accordance with one embodiment of the present invention.
Figure 9B:
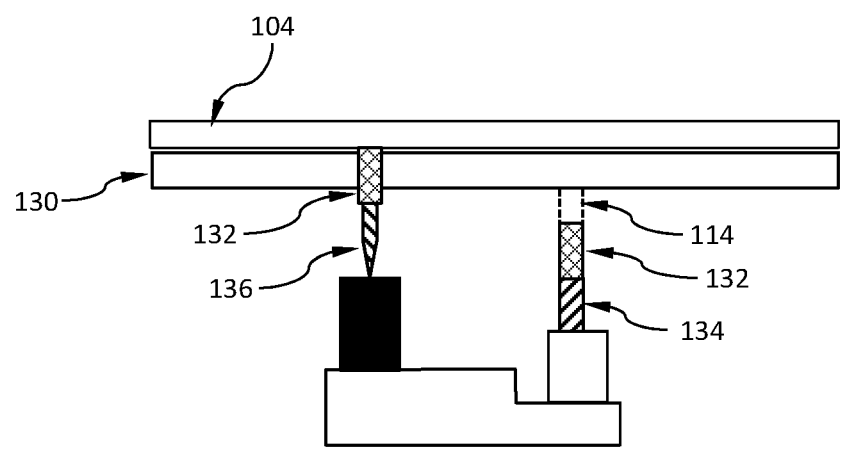
Figure 9C:
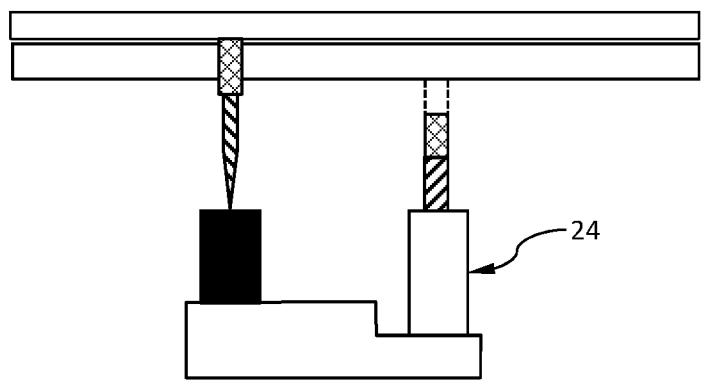

FIG. 9A shows a top view of the positive line 104 and the secondary lead 114 on a light-emitting diode. The FIG. 9B is a side view of FIG. 9A. The positive line 104 is located above the probing substrate 130 and a conductive spring 132 is connected to the bottom through the through hole. Under the conductive spring 132 is a positive probe pin 136. There is a negative line 114 under the probing substrate 130 and is directly and electrically connected to the conductive spring 132. Under the conductive spring 132 is a negative probe pin 134. At present, in many light-emitting diodes, the n-electrode and the p-electrode have different heights. Therefore, for such a probe device, the probe of electrodes of different heights has relatively poor reliability. Therefore, it is better to make the height of the two electrodes the same during the formation of the chips, as shown in FIG. 9C.

Figure 9D:
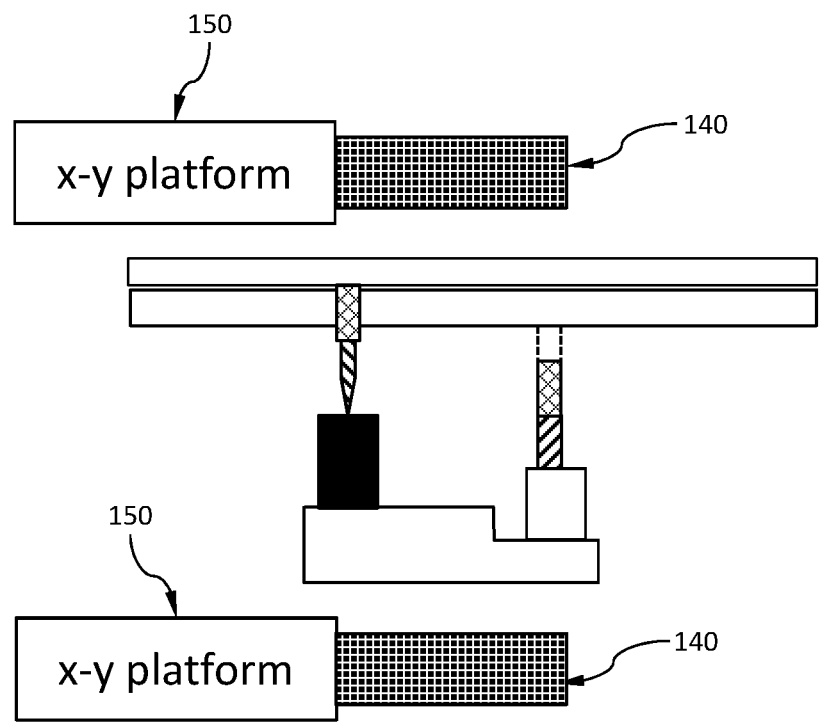
Figure 9E:
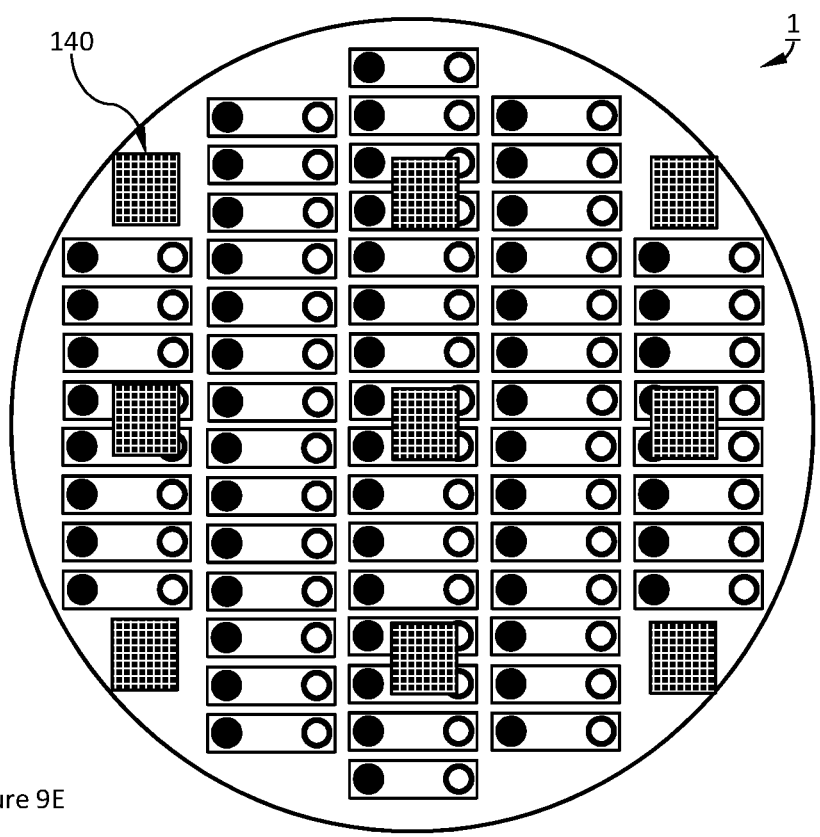

Regarding the probe method of intensity and wavelength, please refer to FIG. 9D. An xy platform 150 is set above or below the die of the light emitting diode and is connected to an optical detector 140. The optical detector 140 may be a charge coupled detector or a complementary metal oxide semiconductor detector. Whether to detect the intensity and wavelength above or below the light-emitting diode chip depends on whether the epi-substrate is transparent or opaque. When the epi-substrate is transparent, the intensity and wavelength can be detected above or below the light emitting diode chips. However, if the epi-substrate is opaque, the intensity and wavelength can only be detected directly above the light-emitting diode chips. On the wafer 1 of a light-emitting diode, the moving speed of the xy platform has its limit, which increases the measurement speed. Several detectors can be distributed on the wafer 1, as shown in FIG. 9E.

Figure 10:
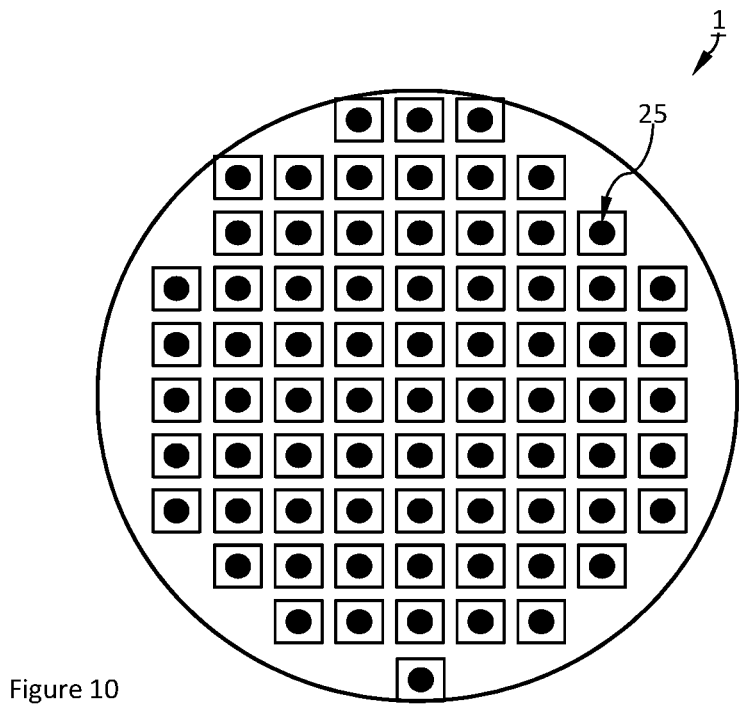
FIG. 10 illustrates LED chips on a wafer.

Another type of light emitting diode electrode is a double-sided electrode, and the probe method will be different. Referring to FIG. 10, the light emitting diode wafer 1 has a plurality of light emitting diode chips, and each chip has a p electrode 25. This type of epi-substrate is electrically conductive, so it can be detected by a common cathode.

Figure 11A:
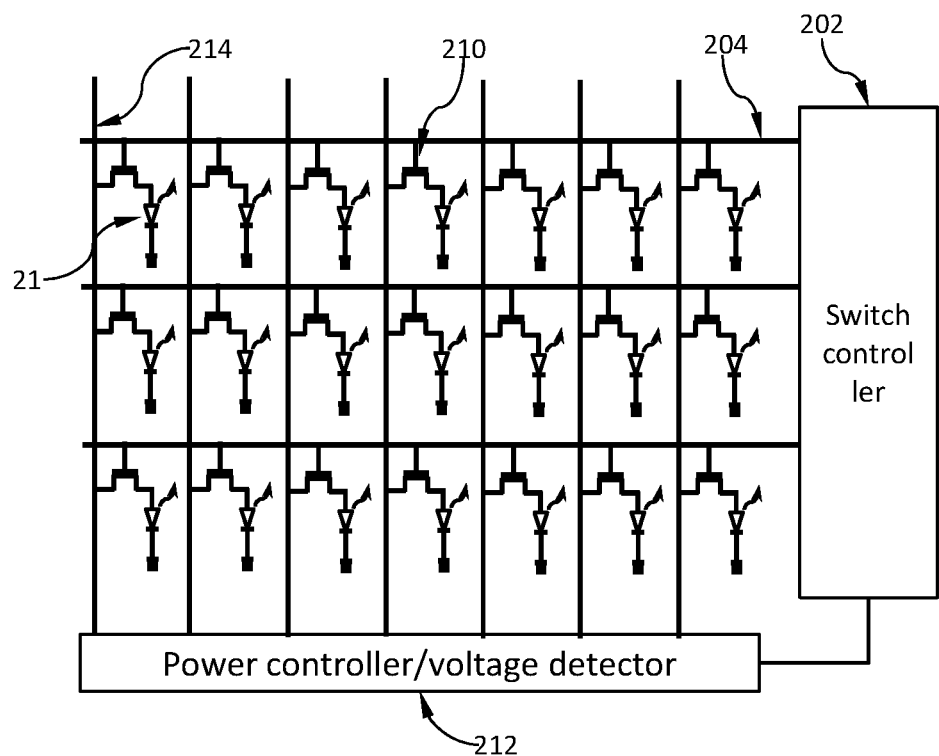
FIG. 11A to FIG. 11E illustrate an apparatus for probing LED chips in accordance with another embodiment of the present invention.
Figure 11B:
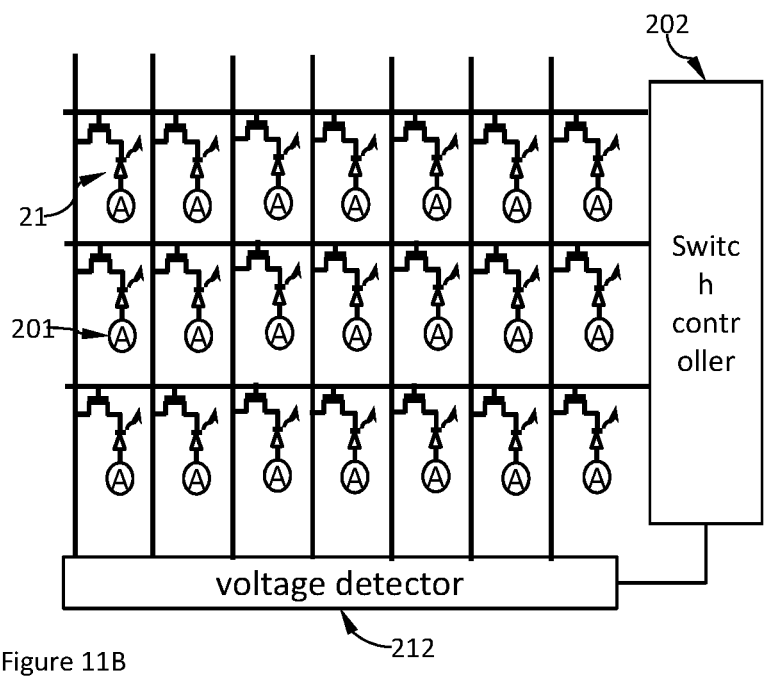
Figure 11C:
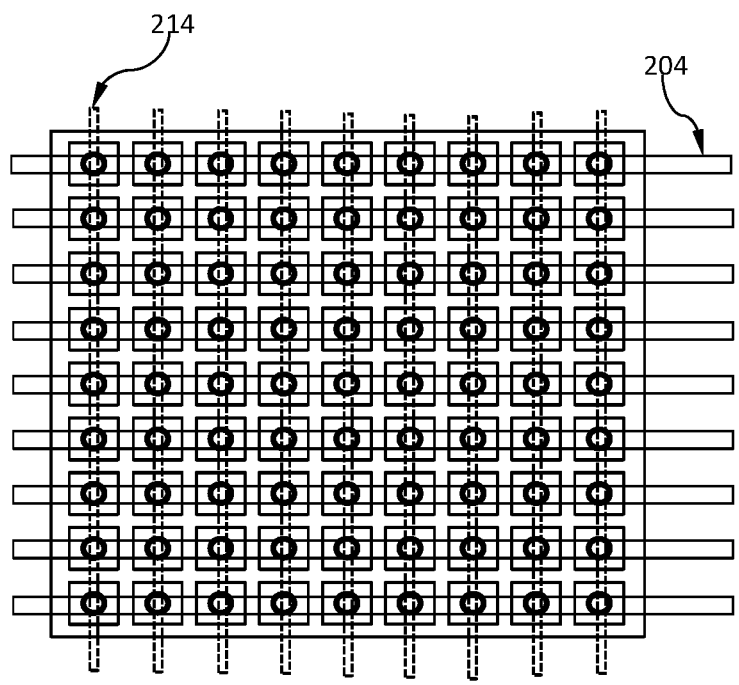
Figure 11D:
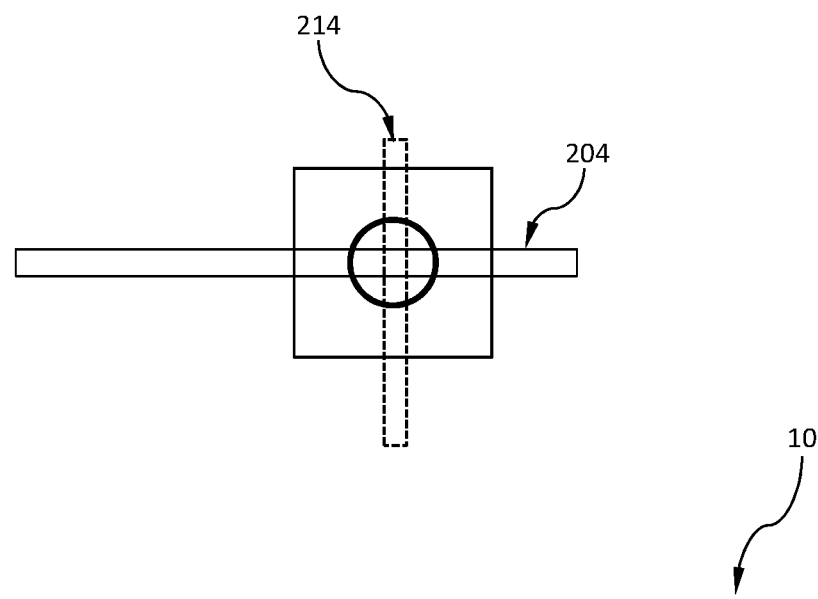
Figure 11E:
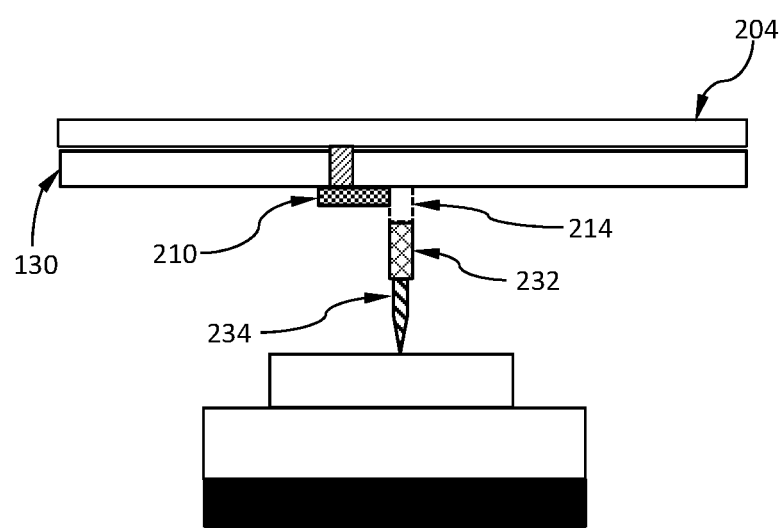

Referring to FIG. 11A, the switch controller 202 is electrically connected to a plurality of control lines 204, and each control line 204 is respectively connected to a gate of a transistor 210. The power controller and the potential detector 212 are electrically connected to a plurality of power lines 214, and are electrically connected to the source of each transistor 210 respectively. The drain of the transistor 210 is electrically connected to the anode of the light emitting diode chip 21, and each light emitting diode chip is grounded. The switch controller 202, and the power controller and the potential detector 212 are respectively connected to a database for recording the forward voltage, intensity, and wavelength of each light-emitting diode chip. However, if the surface of the light-emitting diode is n-type, a common anode method is needed. Referring to FIG. 11B, the anode of each light-emitting diode chip is electrically connected to the power source 201, and the cathode is connected to the drain of the transistor. As before, as long as the switch controller 202 determines that each transistor is on, the light-emitting diode chip corresponding to the electrical connection will light up, and the potential detector 212 will record this forward voltage of the diode. The structure of the actual control line 204 and power line 214 distributed in each light-emitting diode is shown in FIG. 11C. Referring to FIG. 11D, one electrode of a single light-emitting diode chip is just the intersection of the control line 204 and the power line 214. In FIG. 11E, there is a control line 204 above the probing substrate 130 and a transistor 210 below, and the control line 204 is electrically connected to the transistor through the probing substrate 130. One end of the power line 214 is connected to a transistor, and the other end is connected to a conductive spring 232. There is a probe pin 234 under the conductive spring 232.

Figure 12:
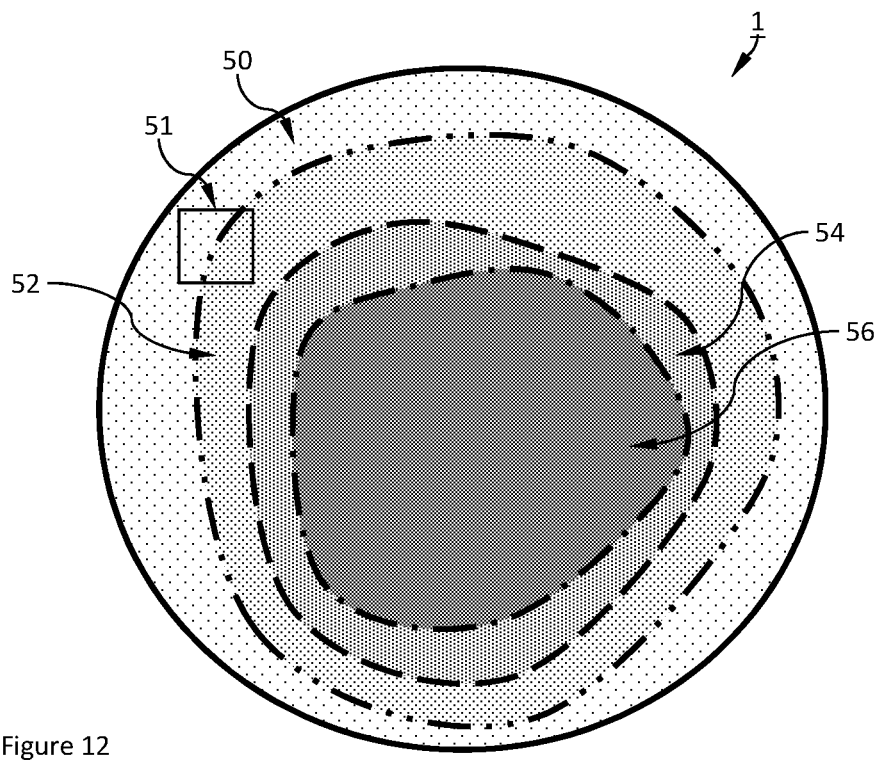
FIG. 12 illustrates a distribution map of a LED wafer according to a probe result.
Figure 13:
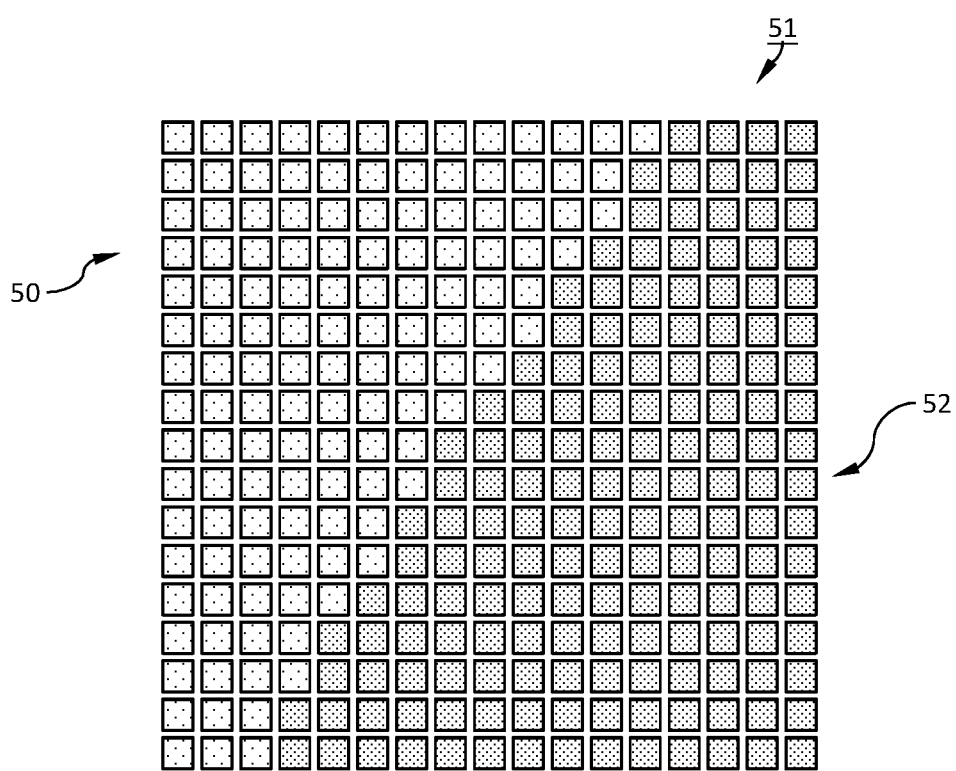
FIG. 13 illustrates a junction area between two distributions in FIG. 12.

When a wafer is probed, the forward voltage must be detected, and the speed of probing can be greatly reduced through the method of the present invention, so that a full probe can be achieved. However, optical probe, whether it is intensity or wavelength, if the movement speed of the xy platform cannot keep up, it will reduce the efficiency of probe. Therefore, there are some methods, such as sampling, to solve this kind of problem. Please refer to FIG. 12, which is a schematic diagram of the distribution of a parameter of a general light-emitting diode after probe. In this embodiment, this is a distribution of wavelengths, and there are four distribution regions, namely distribution 50, distribution 52, distribution 54, and distribution 56. There is a region 51 at the junction of distribution 50 and distribution 52. The detailed diagram of the area 51 is shown in FIG. 13. At the junction, a part of the light-emitting diode chips belong to the distribution 50 and the other side is the distribution 52. For the epitaxial process of light-emitting diodes, the distribution of the same batch should be relatively close. Therefore, for the same batch process, the entire first probe of the first wafer is performed. The obtained information can be used as a reference for future epitaxial wafers. The optical detector 140 only needs to detect the intensity and wavelength when the junctions of the distribution points are measured, and the light-emitting diode chips outside the junctions do not need to measure the intensity and wavelength each because the optical characteristics within the distribution are not easily changed. This can greatly reduce the moving speed of the xy platform. In addition, at the end of the epitaxy, photoluminescence probe will be performed on the entire wafer. This data can also be used as a reference for the optical probe reference of the light emitting diode chips.

Figure 14:
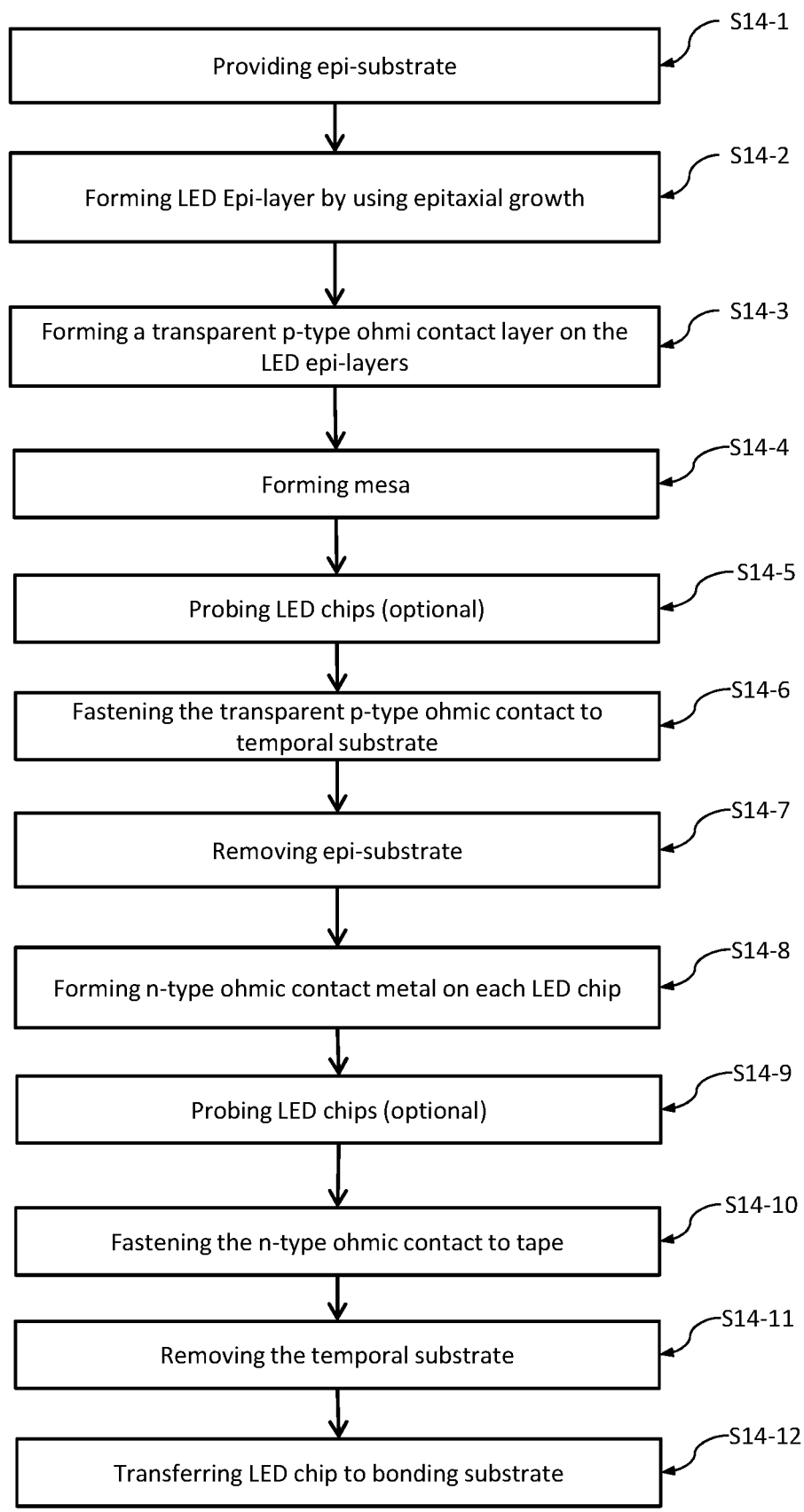
FIG. 14 is a flow chart to mass transfer LED chips to a bonding substrate in accordance with one embodiment of the present invention.
Figure 15A:
FIG. 15A to FIG. 15I illustrate cross sectional views of each stage from epitaxial process to mass transfer LED chips in accordance with one embodiment of the present invention.
Figure 15B:
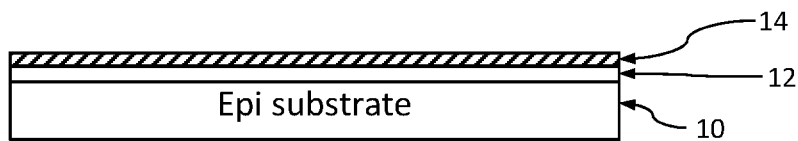
Figure 15C:
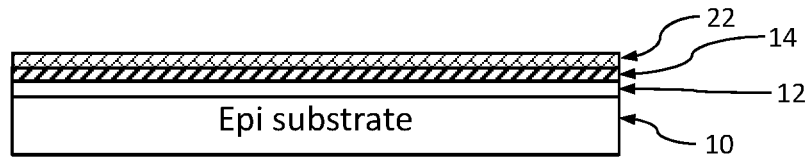
Figure 15D:
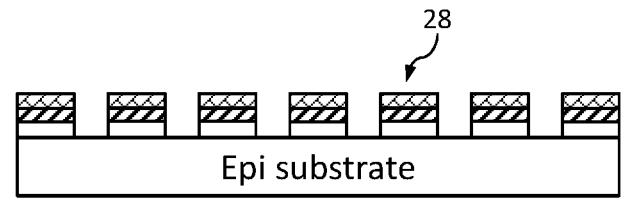
Figure 15E:
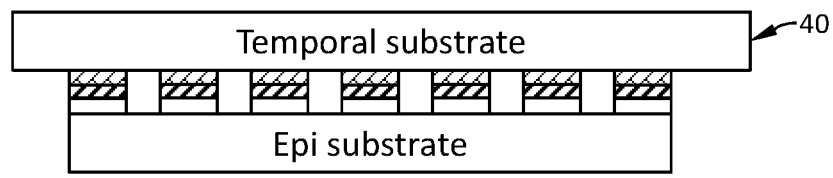
Figure 15F:
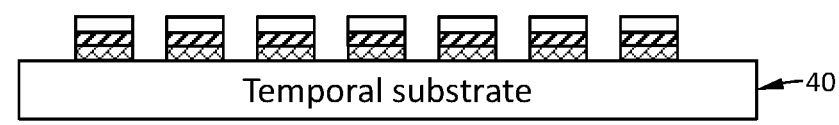
Figure 15G:
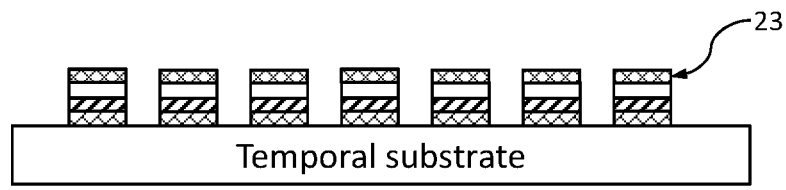
Figure 15H:
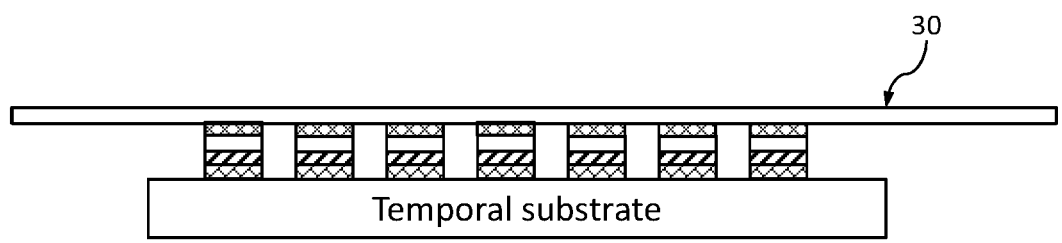
Figure 15I:
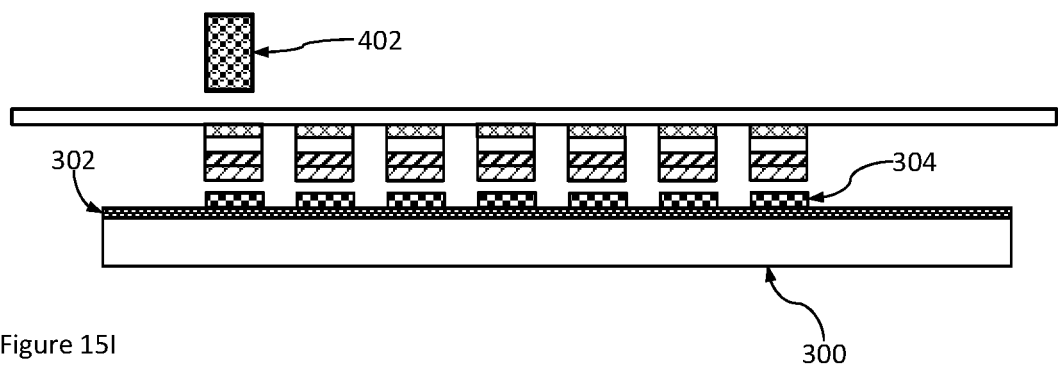

The FIG. 14 illustrates the process from the start of the epitaxial to the completion of the light-emitting diode display panel. An epi-substrate is provided first (step S14-1). After that, an epitaxial layer of a light emitting diode is formed on the epi-substrate (step S14-2). Then, a transparent p-type ohmic contact layer is formed on the epitaxial layer (step S14-3). Next, a plurality of mesas is formed (step S14-4). The next step is an optional step of directly probing each light-emitting diode chip, and recording the probed value of each light-emitting diode chip (step S14-5). After that, a temporary substrate is fastened on the p-type ohmic contact layer (step S14-6). Next, the epi-substrate is removed (step S14-7). An n-type ohmic contact layer and an n electrode are formed on each of the light emitting diode chips (step S14-8). If probe has not been performed before, probe of each light-emitting diode chip can be performed at this time (step 14-9). After that, a tape is attached to the n electrode (step S14-10). Then, the temporary substrate is removed (step S14-11). Finally, each light-emitting diode chip is transferred to the bonding substrate (step S14-12).

The flow chart of FIG. 14 can be referred to FIG. 15 for details. Referring to FIG. 15A, an epi-substrate 10 is provided. Thereafter, an n-type conductive layer 12 and a p-type conductive layer 14 are sequentially formed on the epi-substrate 10, as shown in FIG. 15B. Thereafter, a transparent p-type ohmic contact layer 22 is formed on the p-type conductive layer 14 as shown in FIG. 15C. A transparent p-type ohmic contact layer will be used to indicate that the light-emitting direction of the subsequent light-emitting diode chips will pass through the p-type ohmic contact layer to emit light. Then, the epitaxial layer of the light emitting diode and the p-type ohmic contact layer 22 are etched to form a plurality of mesas 28, as shown in FIG. 15D. After that, a temporary substrate 40 is first fastened on the p-type ohmic contact layer 22, as shown in FIG. 15E. At this time, the epi-substrate 10 can be removed, as shown in FIG. 15F. After that, an n-type ohmic contact layer 23 is formed on the n-type conduction layer 12, as shown in FIG. 15G. At this time, the chips of the light-emitting diode are considered complete. A tape is adhered to the n-type ohmic contact layer 23 as shown in FIG. 15H. After that, the temporary substrate 40 can be removed, or the temporary substrate 40 can be diced away, and the temporary substrate 40 itself must be a conductive metal. After that, each single light-emitting diode chip is bonded to the bonding substrate 300 with the hitting pin 402, as shown in FIG. 15I. The bonding substrate 300 has a bonding pad 304 electrically connected to the light emitting diode chips, and a driving circuit 302 can individually drive the intensity of each light emitting diode chip.

Figure 16A:
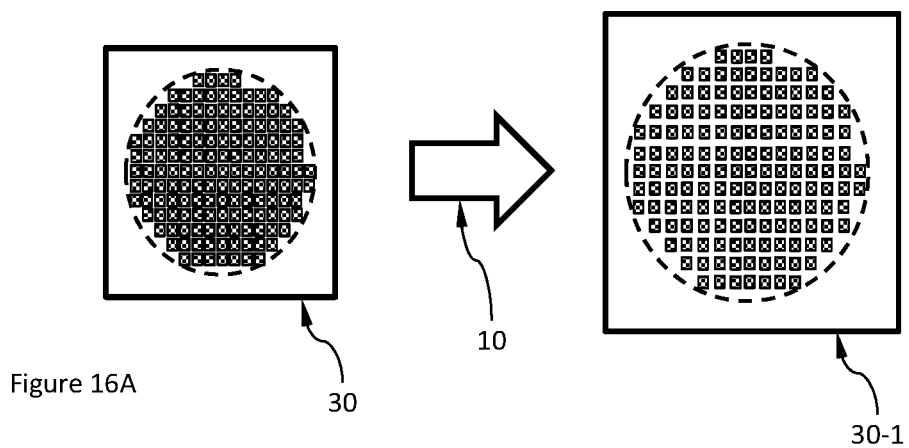
FIG. 16A and FIG. 16B illustrate mass transfer by using expanding tape in accordance with one embodiment of the present invention.
Figure 16B:
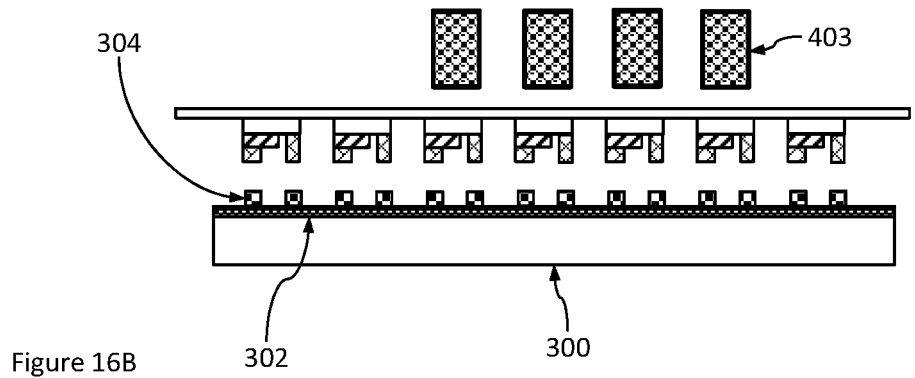

Transferring the light-emitting diode chips to the bonding substrate, if only one light-emitting diode chip can be transferred at a time, it will take too much time without commercial value. Therefore, a better way is to expand the tape 30 first, so that the distance between the chips of each light-emitting diode is the same as the distance between the bonding pads on the bonding substrate. At this time, a large amount of light emitting diode chips are transferred to the bonding substrate at one time. Referring to FIG. 16A, the tape 30 is first expanded to become the tape 30-1. Here, the expansion of the tape 30 may not be uniform, but the interval of the light-emitting diode chips of a block must match the interval of the bonding positions on the bonding substrate. Please refer to FIG. 16B, at this time, a plurality of hitting pins 430 are used to transfer the light-emitting diode chips that meet the requirements to the bonding substrate 300.

The invention can also be applied to the chip structure of other light-emitting diodes. Please refer to FIG. 17 to introduce the process from the start of the epitaxial to the completion of the light-emitting diode display panel. First, an epi-substrate is provided (step 17-1). Then, a light emitting diode epitaxial layer is formed on the epi-substrate (step 17-2). Next, a transparent p-type ohmic contact layer is formed on the light emitting diode epitaxial layer (step 17-3). Then, a plurality of mesas are formed (step 17-4). Next, probe is performed for each light emitting diode (step 17-5). The light-emitting diode chips are transferred to a bonding substrate (step 17-6). A dielectric material is filled among these light emitting diode chips (steps 17-7). Finally, an n-type ohmic contact is formed on each of the light emitting diode chips.

Figure 17:
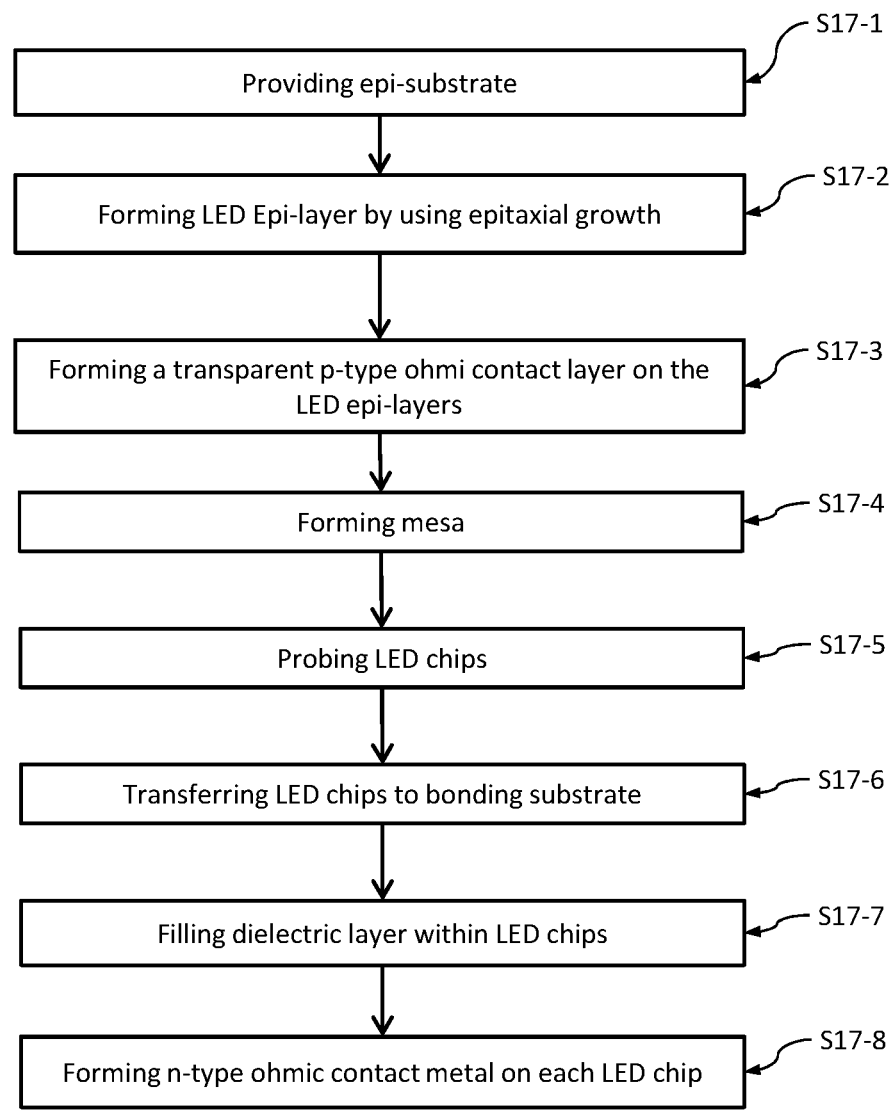
FIG. 17 is a flow chart to mass transfer LED chips to a bonding substrate in accordance with another embodiment of the present invention.
Figure 18A:
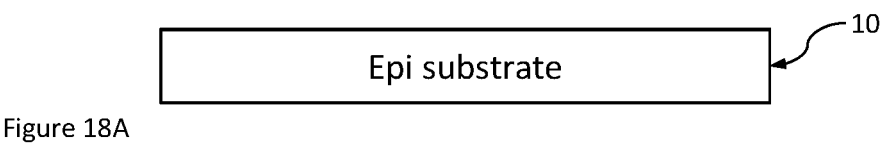
FIG. 18A to FIG. 18F illustrate cross sectional views of each stage from epitaxial process to mass transfer LED chips in accordance with another embodiment of the present invention.
Figure 18B:
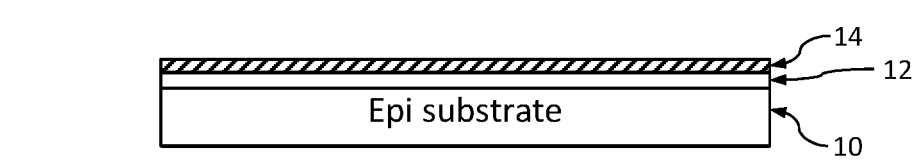
Figure 18C:
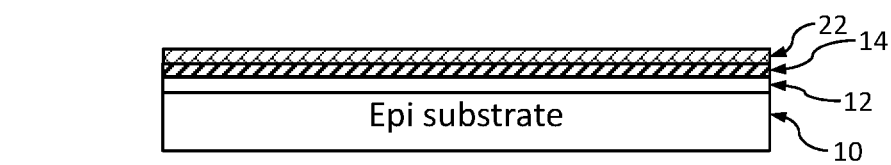
Figure 18D:
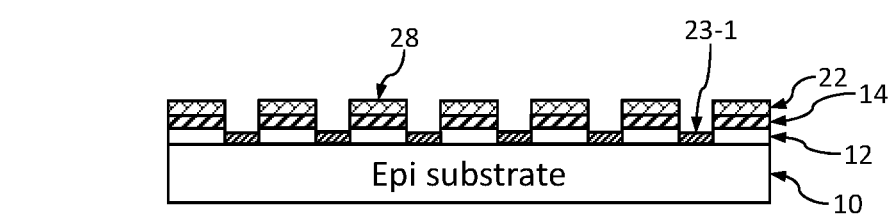
Figure 18E:
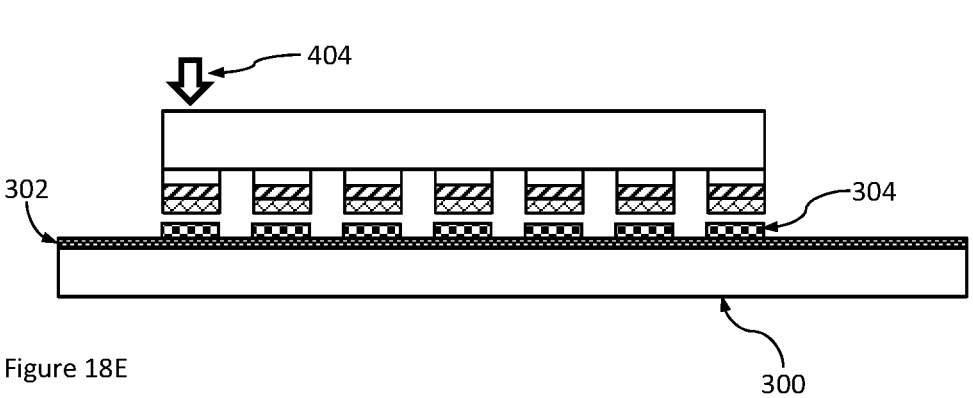
Figure 18F:
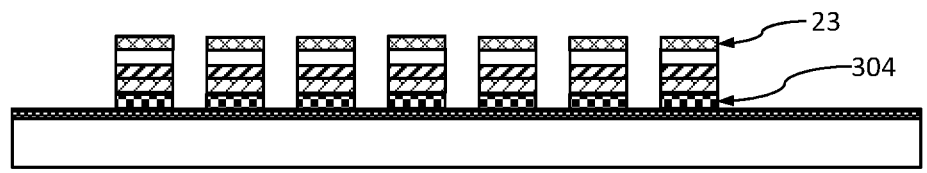

FIG. 18 detail the structure diagram of the steps of FIG. 17. Referring to FIG. 18A, an epi-substrate 10 is first provided. Thereafter, an n-type conductive layer 12 and a p-type conductive layer 14 are sequentially formed on the epi-substrate 10, as shown in FIG. 18B. Next, a transparent p-type ohmic contact layer 22 is formed on the p-type conductive layer 14, as shown in FIG. 18C. After that, the platforms 28 are formed first, and an n-type ohmic contact layer 23-1 is formed between the platforms, as shown in FIG. 18D. This structure can be used for probe of all light-emitting diode chips, mainly because the epi-substrate 10 is a non-conductive sapphire substrate here. Next, the entire epi-substrate 10 is flipped and each of the bonding pads 304 on the bonding substrate 300 is laser lift-off 404, so that each light-emitting diode chip is separated from the epi-substrate 10, as in FIG. 18. When all the light-emitting diode chips are transferred to the bonding substrate 300, the n-type ohmic contact layer 23 is formed for all the light-emitting diode chips.

The present invention provides another implementation method for transferring another light emitting diode chip structure to a bonding substrate. For a flow chart, please refer to FIG. 19. First, an epi-substrate is provided (step 19-1). Next, an epitaxial layer is formed on the epi-substrate (step 19-2). A mesa is then formed (step 19-3). Form n and p ohmic contact electrodes on each light emitting diode mesa (step 19-4). At this time, the probe of each light-emitting diode can be directly measured (step 19-5). After that, a temporary substrate is first fastened on the n and p ohmic contact electrodes (step 19-6). Then, the epi-substrate is directly removed (step 19-7). On the side where a tape is attached to the light-emitting diode chip from which the epi-substrate is removed (step 19-8). The temporary substrate is then removed (steps 19-9). Finally, the plurality of light-emitting diode chips is transferred to the bonded substrate (steps 19-10).

Figure 19:
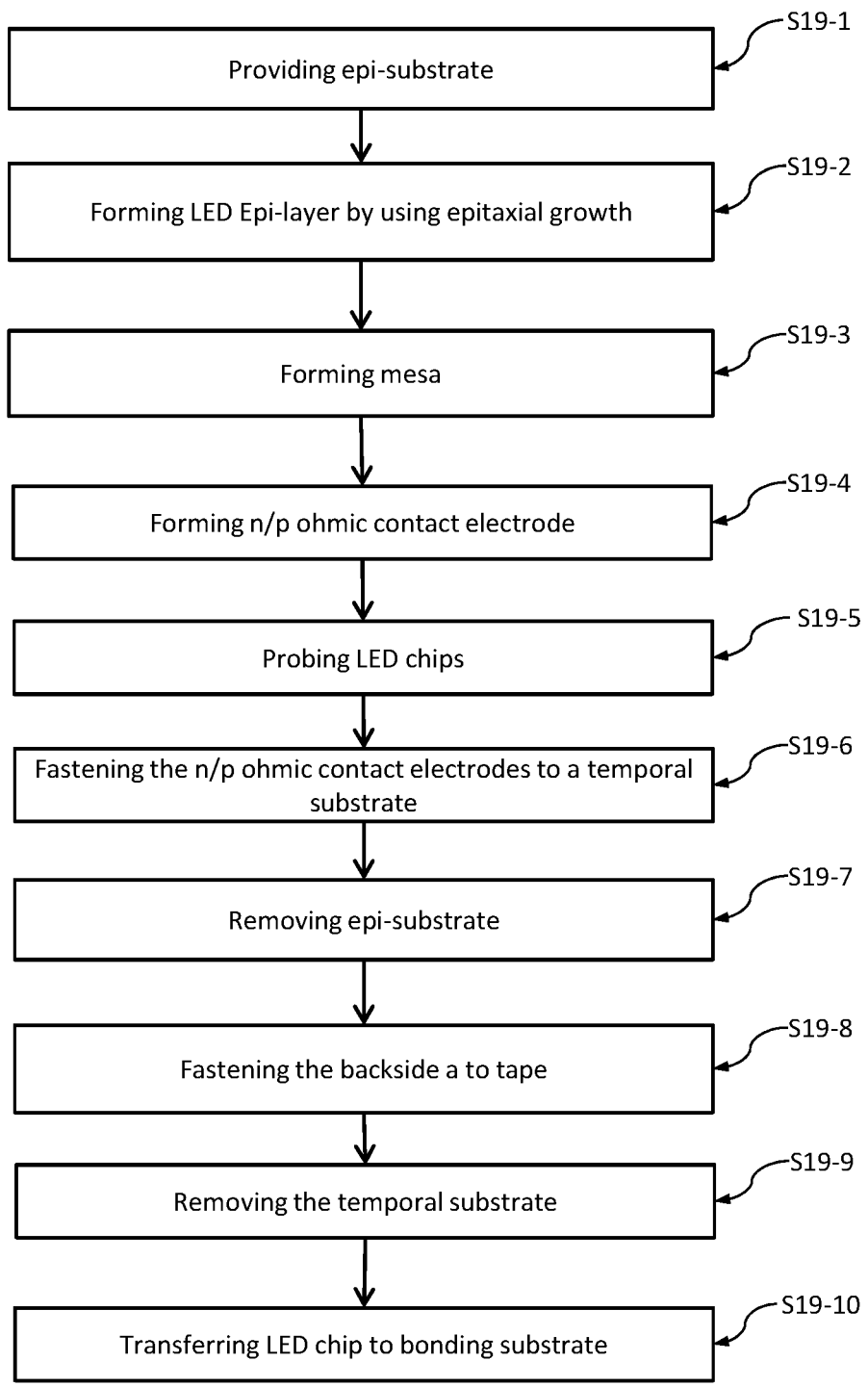
FIG. 19 is a flow chart to mass transfer LED chips to a bonding substrate in accordance with another embodiment of the present invention.
Figure 20A:
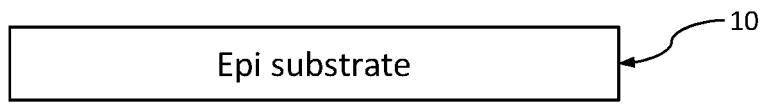
FIG. 20 A to FIG. 20H illustrate cross sectional views of each stage from epitaxial process to mass transfer LED chips in accordance with another embodiment of the present invention.
Figure 20B:
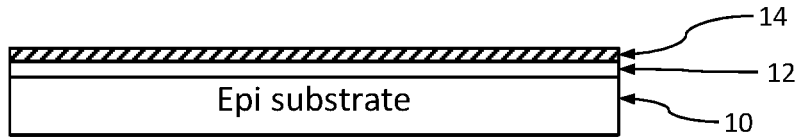
Figure 20C:
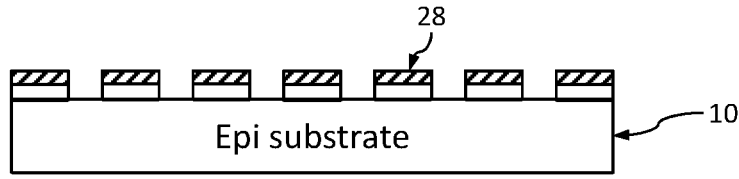
Figure 20D:
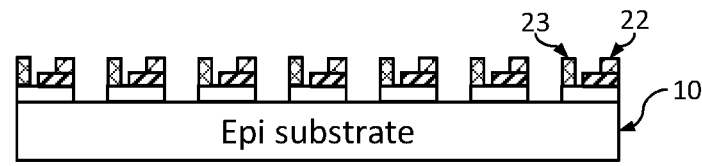
Figure 20E:
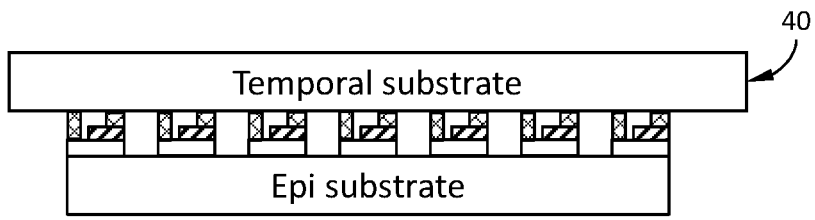
Figure 20F:
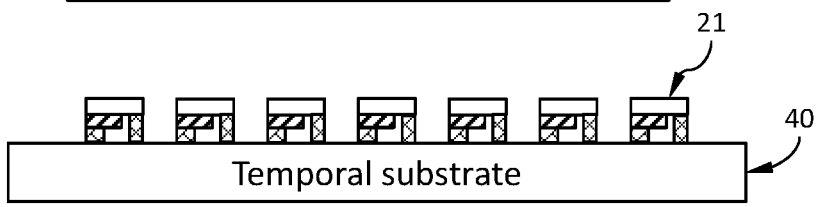
Figure 20G:
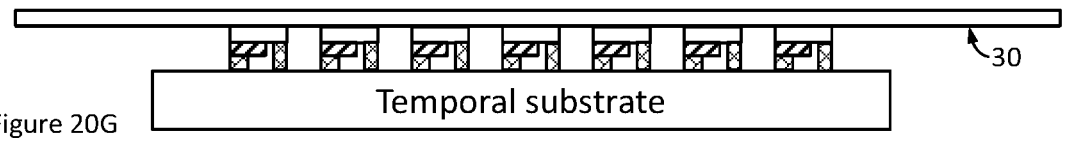
Figure 20H:
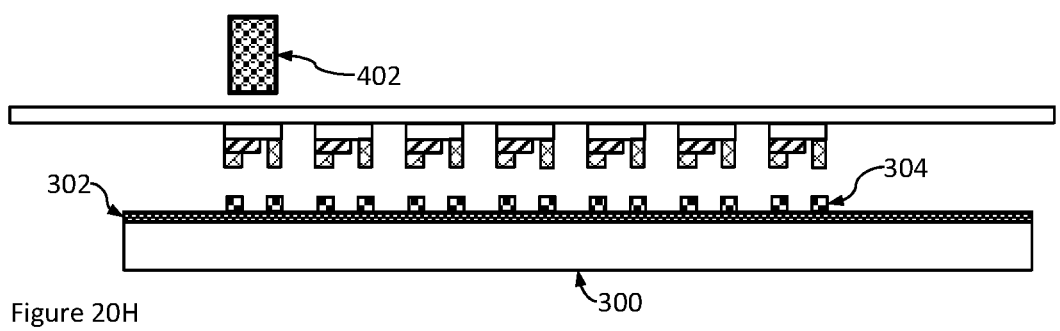
Figure 21A:
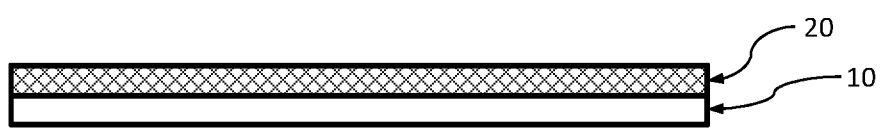
FIG. 21 A to FIG. 21E illustrate cross sectional views of each stage of LED chip formation in accordance with another embodiment of the present invention.
Figure 21B:
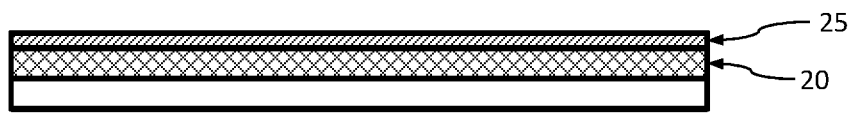
Figure 21C:
Figure 21D:
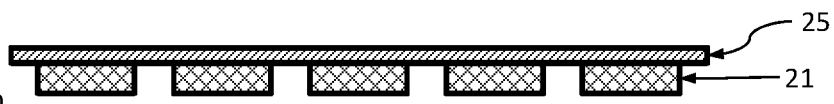
Figure 21E:
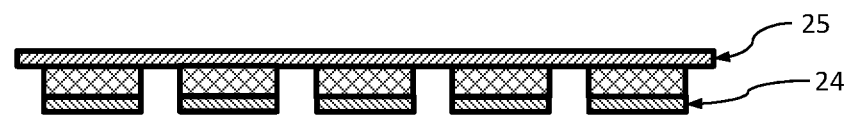

FIG. 20 is a detailed structural diagram of the steps in the process of FIG. 19. Referring to FIG. 20A, an epi-substrate 10 is first provided. After that, an n-type conductive layer 12 and a p-type conductive layer 14 are sequentially formed on the epi-substrate 10, as shown in FIG. 20B. A plurality of mesas 28 are formed on the epitaxial layer, as shown in FIG. 20C. N and p ohmic contact electrodes 22 and 23 are formed on each stage 28, as shown in FIG. 20D. Then, a temporary substrate 40 is fastened to the n-ohmic contact electrode 23 and the p-ohmic contact electrode 22, as shown in FIG. 20E. At this time, return to remove the original epi-substrate 10, as shown in FIG. 20F. A tape 30 is fastened to the back surfaces of all the dies of the light emitting diodes, as shown in FIG. 20G. After that, the temporary substrate 40 is removed, and the light-emitting diode chips located on the tape are transferred to the bonding electrodes 304 on the bonding substrate 300 through the hitting pin 402.

FIG. 21 shows a flowchart of the steps of another light-emitting diode chip structure, from epitaxy to mas transfer. First, a light-emitting diode epitaxial layer 20 is formed on an epi-substrate 10, as shown in FIG. 21A. Then, a p-type ohmic contact layer 25 is formed on the light emitting diode epitaxial layer 20, as shown in FIG. 21B. Here, the thickness of the p-type ohmic contact layer 25 is sufficiently thick, and the material is not limited to a transparent material, and may be a non-transparent material. Using the p-type ohmic contact layer 25 as a base, the epi-substrate 10 is removed, as shown in FIG. 21C. Thereafter, chips 21 are formed on the light-emitting diode epitaxial layer. Next, an n-ohmic contact electrode 24 is formed on the light-emitting diode epitaxial layer 20 and the removed epi-substrate 10 side. After that, through this structure, a tape is pasted, and the chips of each light-emitting diode are diced out, and a huge amount of transfer can be performed.

In order to carry out massive transfer of bonding substrates, basically, there must be a driving circuit, that is, there will be a transistor at each position of the light-emitting diode chips. This can refer to the traditional thin film transistor manufacturing process for liquid chip displays. For the light-emitting diode chips of the same surface electrode, the driving circuit, that is, the transistor and the circuit are all completed, and then the light-emitting diode chips can be bonded. However, for the light-emitting diode chips of the double-sided electrode, there is no electrical connection between the light-emitting diode and the electrode on the other side, which will have other subsequent processes and cause a lot of inconvenience. However, as the resolution of the display continues to increase, the size of the light-emitting diode chips will shrink, and the same area of the electrode will cause the light-emitting area to be too small. The present invention provides another structure and process for forming a driving circuit for such a double-sided electrode.

Figure 22A:
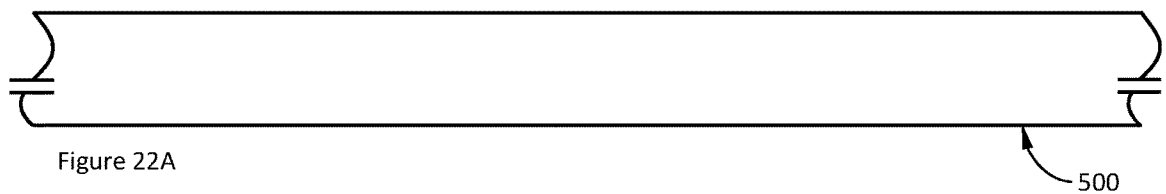
FIG. 22A to FIG. 22P illustrate cross sectional views of LED display formation at each stage in accordance with one embodiment of the present invention.
Figure 22B:
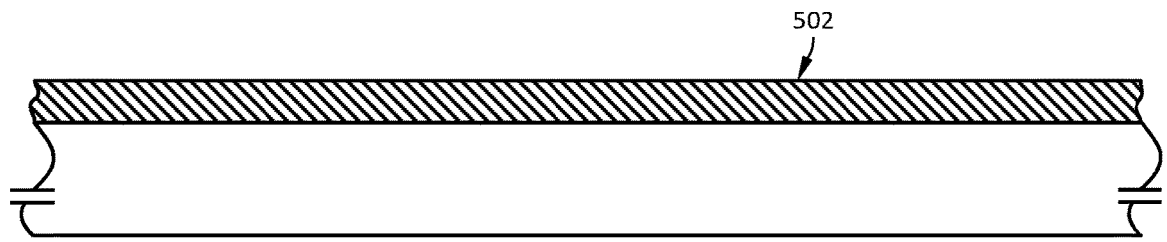
Figure 22C:
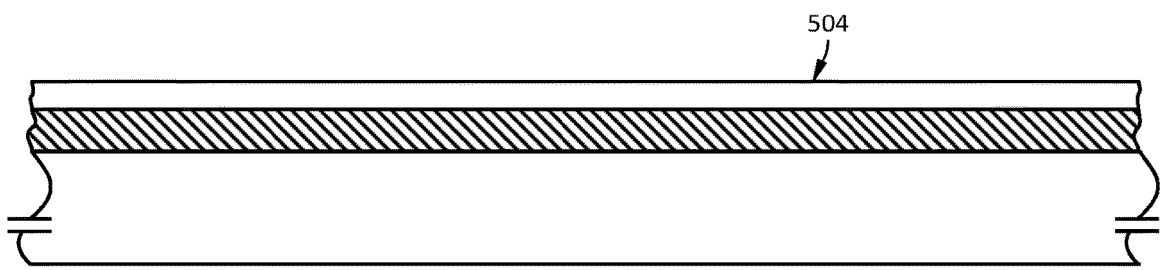

Referring to FIG. 22A, a display substrate 500 is first provided. The display substrate 500 here is the previous bonding substrate, which can be a fully transparent glass substrate. The manufacturing process needs to comply with the traditional thin film transistor manufacturing process specifications, for example, the temperature cannot be too high to avoid glass melting. If a sapphire substrate is used, the subsequent process temperature can be raised to close to one thousand degrees, and the semiconductor process of silicon can be applied to the present invention. When a conventional thin film transistor is used, the semiconductor layer is amorphous silicon, and the reaction speed of the transistor is slow. When a silicon semiconductor process can be used, the semiconductor layer of the transistor can use poly silicon, and the efficiency of the transistor will be much better. Referring to FIG. 22B, a metal layer 502 for grounding is formed on the substrate 500. Here, the metal layer 502 may be uniformly and completely covered on the substrate 500, or may be patterned and formed only in some specific regions, but all of them must be electrically connected to each other. The metal layer 502 here is for the common cathode of the light-emitting diode chips, so there is no special requirement. The simplest is to form metal aluminum by evaporation or sputtering. However, any other metal is applicable here. Referring to FIG. 22C, a dielectric layer 504 is uniformly covered on the metal layer. The dielectric layer 504 here can be any material, as long as the transmittance to visible light is higher. Generally, traditional and mature materials such as silicon nitride or silicon oxide can be used, and the process can be formed by any chemical vapor phase method. Alternatively, tetraethoxysilane (TEOS) can be coated on the metal layer 502 by a spin coating method. The purpose of the dielectric material 504 is to electrically isolate the underlying metal layer 502.

Figure 22D:
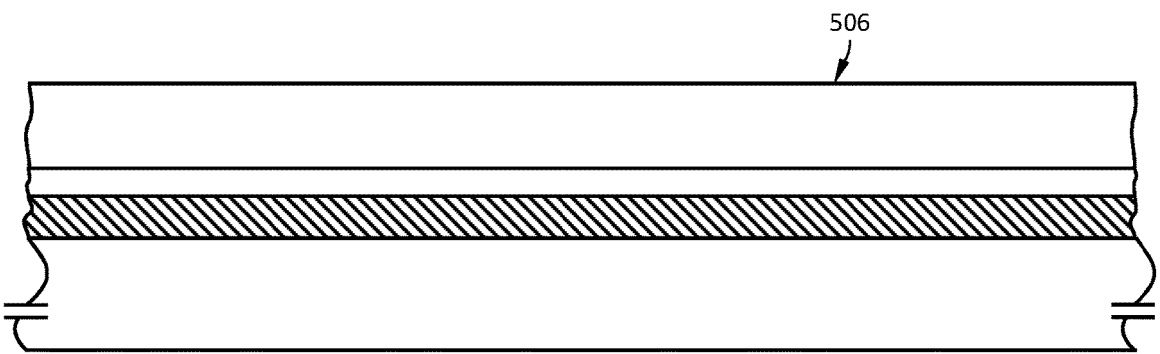
Figure 22E:
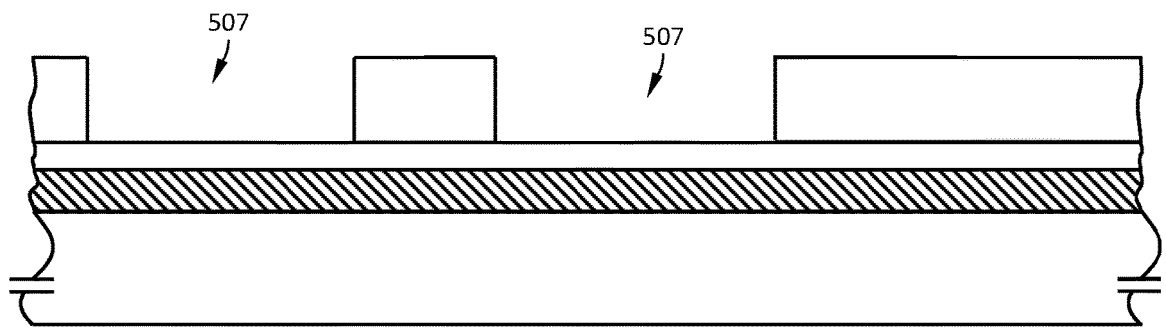
Figure 22F:
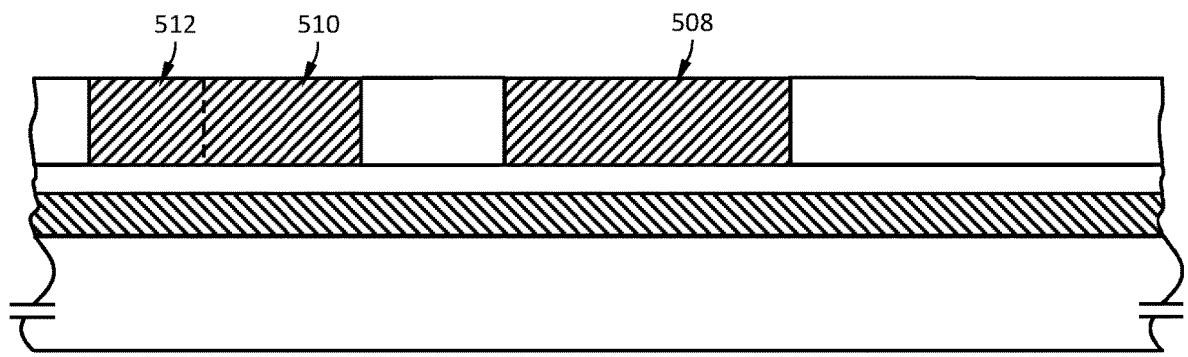

Referring to FIG. 22D, another dielectric material layer 506 is formed on the dielectric material 504. The material may be the same as the dielectric material 504 and have the same manufacturing process. Referring to FIG. 22E, an opening pattern 507 is formed in the dielectric material 506. The opening pattern 507 here is mainly for later transistors and circuits. The opening pattern 507 can be formed by using a conventional lithography process and etching, or by using a lift-off method. Referring to FIG. 22F, a metal layer is filled in the opening pattern 507, which is a drain 508 of the transistor, a source 510 of the transistor, and a signal line 512. The extension drain 508 also provides a location for the subsequent bonding of the light-emitting diode chip. The metal layer here can be made of any metal, such as metal aluminum or other thin film transistors or any metal used in semiconductor manufacturing processes.

Figure 22G:
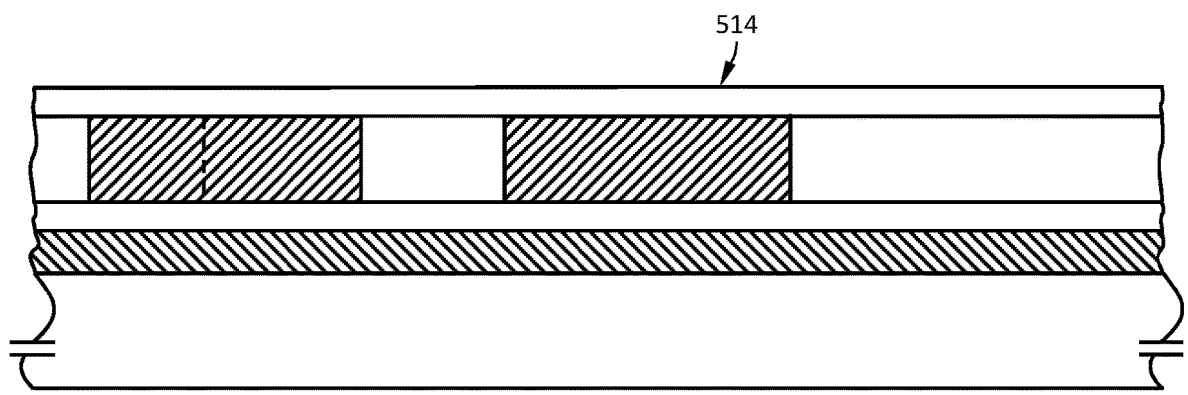
Figure 22H:
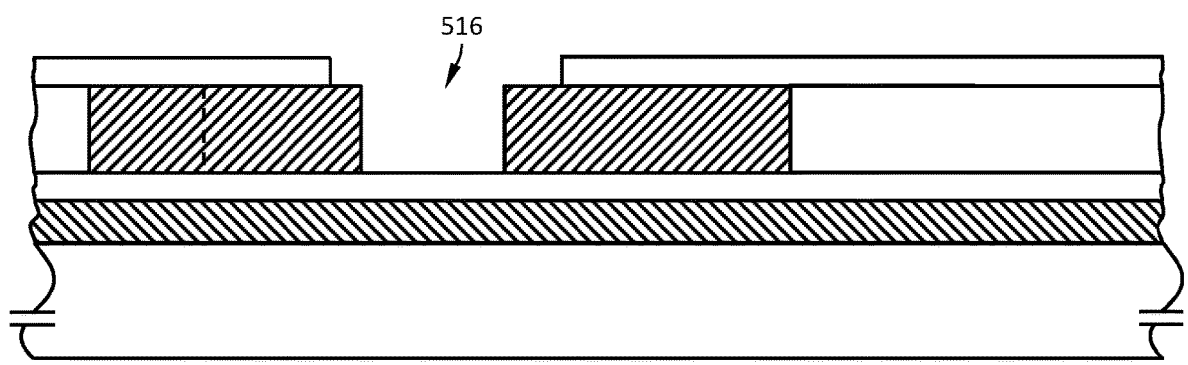

Please refer to FIG. 22G, and directly cover a dielectric layer 514 thereon. The material of the dielectric layer 514 can be the same as the previous dielectric material, such as silicon oxide or silicon nitride, or silicon oxynitride. Referring to FIG. 22H, an opening pattern 516 is formed in the dielectric material layer 514 and the dielectric material layer 506. The opening pattern 516 here is mainly a semiconductor layer of the transistor after formation.

Figure 22I:
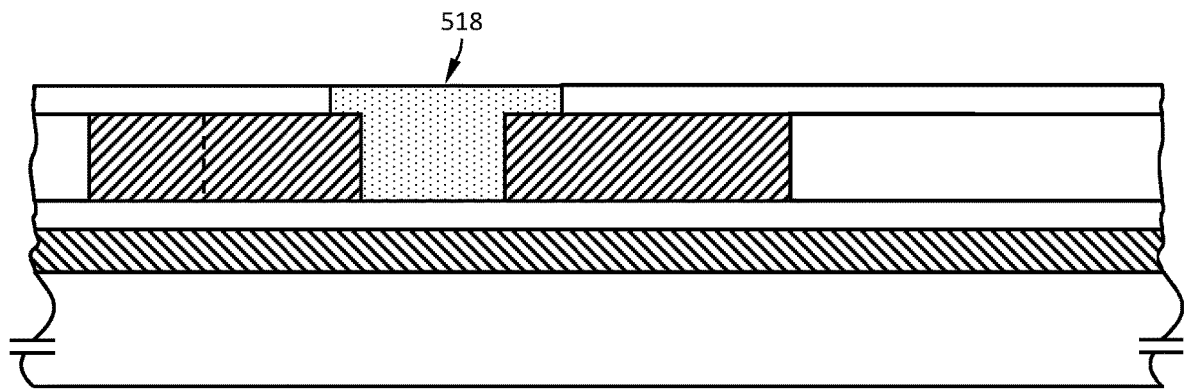
Figure 22J:
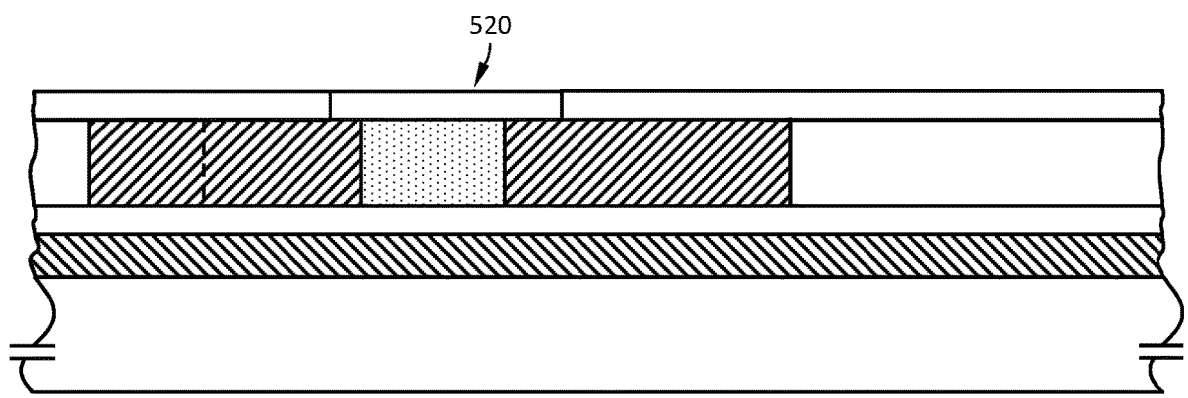

Referring to FIG. 22I, a semiconductor layer 518 is filled in the opening pattern 516. The semiconductor layer here can be amorphous silicon or poly silicon, depending on the process temperature. In addition, the semiconductor layer 518 can be doped with tri-valent ions to become a p-type semiconductor layer, so that the transistor becomes an n-type transistor. Referring to FIG. 22J, the surface of the semiconductor layer 518 is oxidized to form a gate dielectric layer 520. There are many ways to oxidize, and any high temperature oxidation can be used.

Figure 22K:
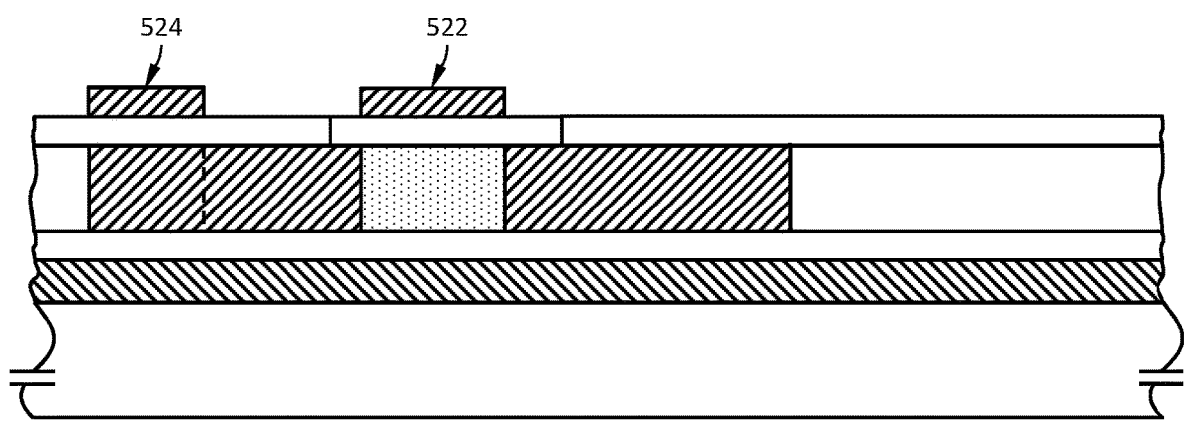
Figure 22L:
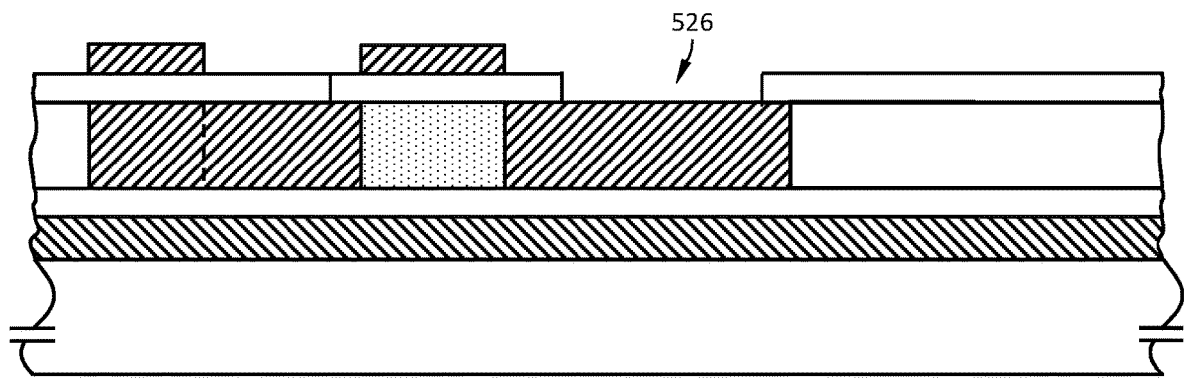
Figure 22M:
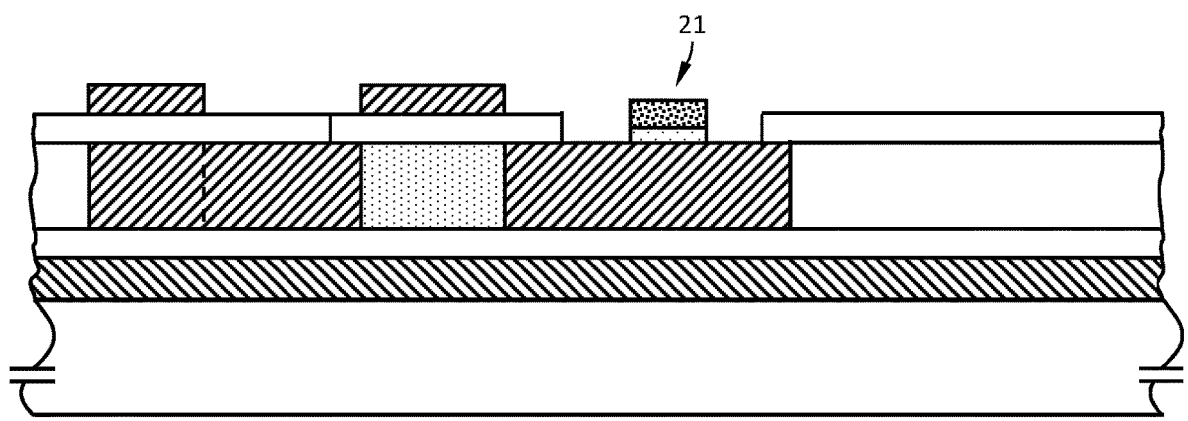
Figure 22N:
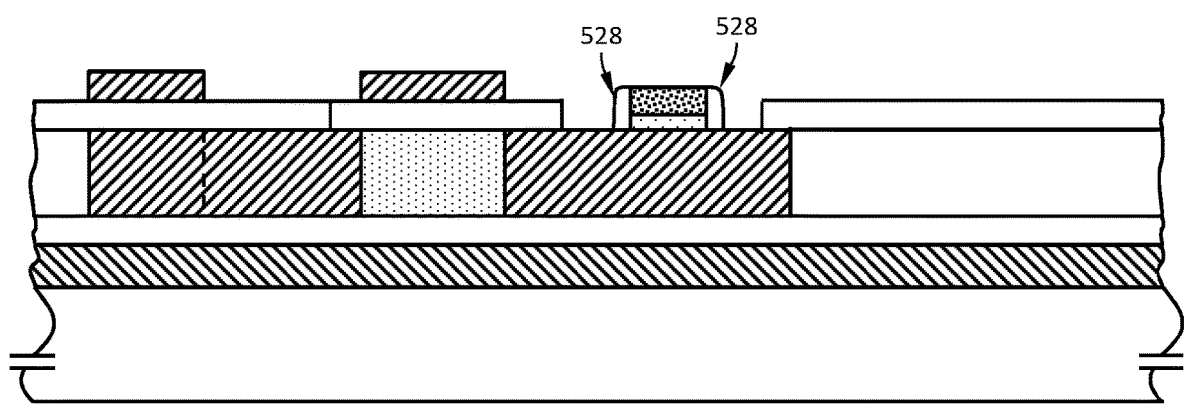
Figure 22O:
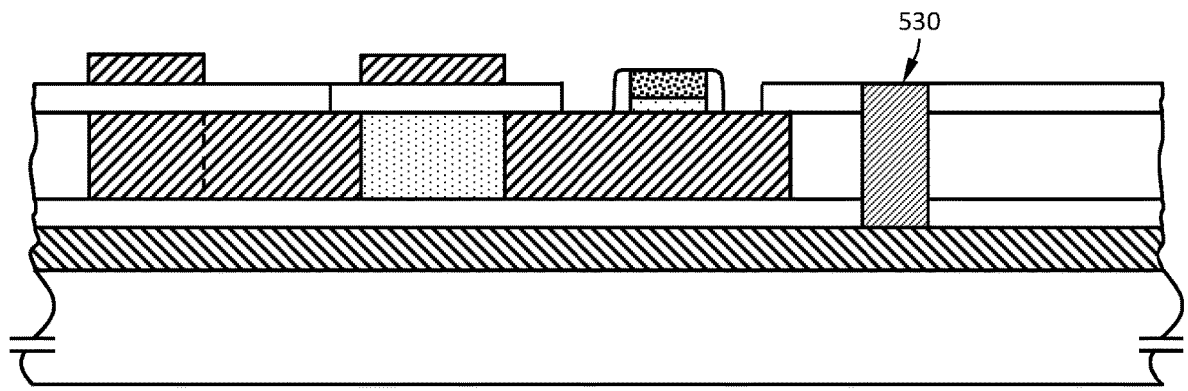

Referring to FIG. 22K, a gate 522 and a scan line 524 are formed on the gate dielectric layer 520 and the dielectric layer 514, respectively. The gate electrode 522 here is made of the same material as the scan line 524, and may be any metal, and is formed by pattern transfer. Referring to FIG. 21I, an opening pattern 526 is formed on the dielectric layer 514 above the drain 508. Referring to FIG. 22M, the light emitting diode chip 21 is bonded inside the opening pattern. Here, the transfer method mentioned in the previous embodiment can be used.

Figure 22P:
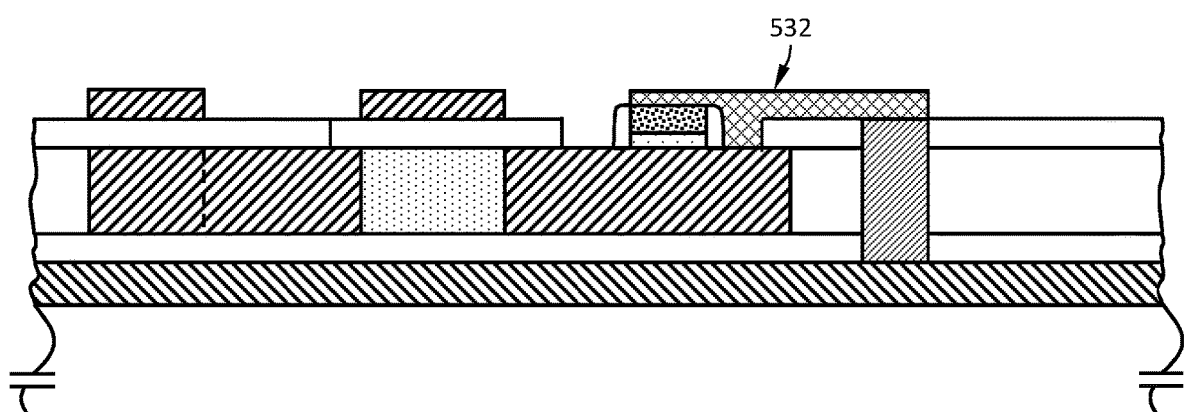

Referring to FIG. 21N, a spacer 528 is formed on the sidewall of the light-emitting diode chip 21 to electrically isolate the light-emitting diode chip. The formation method is the same as the traditional method of forming a spacer on sidewall of the gate in the silicon semiconductor process. Referring to FIG. 21O, an opening is formed in each of the dielectric material layers 514, 506, and 504 near the light-emitting diode chip 21, and then a metal is filled as a metal plug 530. Referring to FIG. 22P, another metal layer 532 is formed between the light-emitting diode chip 21 and the metal plug 530, so that the light-emitting diode chip can be electrically connected to the underlying metal layer 502.

Figure 23:
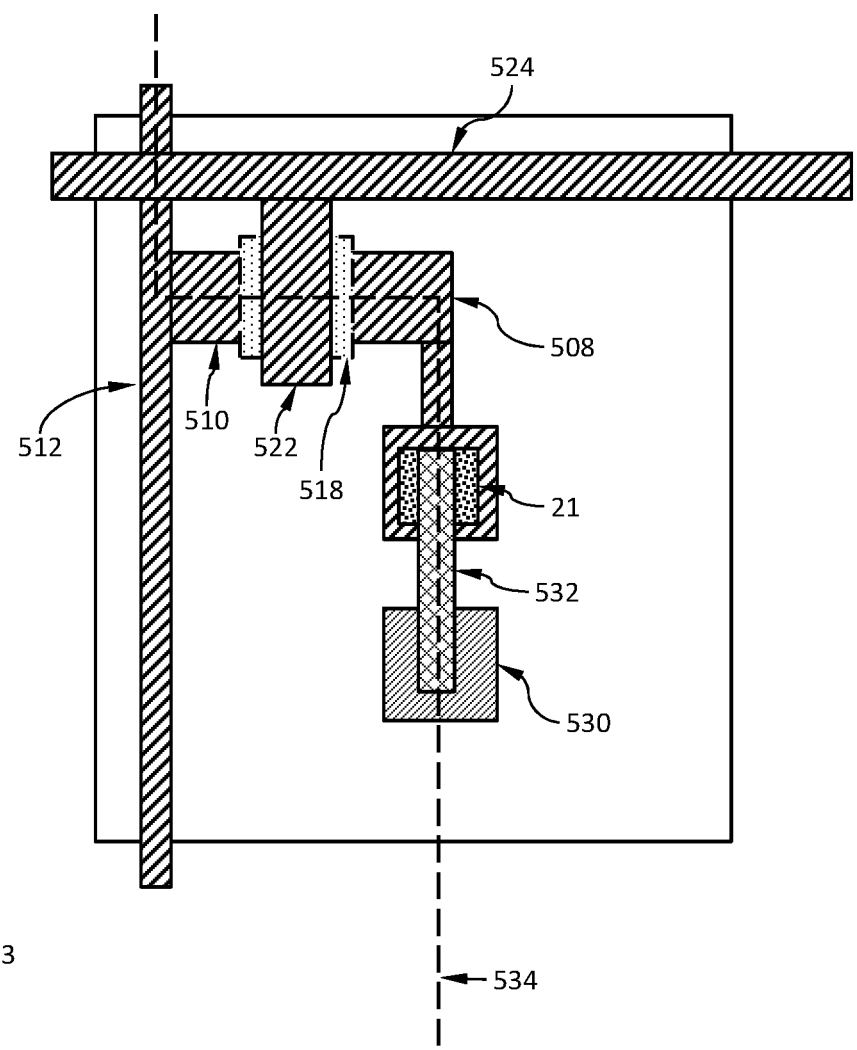
FIG. 23 illustrates a top view of one pixel of the LED display in accordance with one embodiment of the present invention.

Please refer to FIG. 23, which is a top view of FIG. 22. The transistor includes a gate 522, a source 510, a drain 508, and a semiconductor layer 518. The signal line 512 is electrically connected to the source 508 of the transistor, and the scan line 524 is electrically connected to the gate 522 of the transistor. The light emitting diode chip 21 is on an extension region of the drain electrode 508 and is electrically connected to the metal plug 530 through the metal layer 532. Cross sectional line 534 shows the sectional structure in FIG. 22.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An apparatus for probing a plurality of LED chips, comprising:
   an array of probing pins for electrically contacting each electrode of the plurality of LED chips;
   a driving circuit for providing currents to the plurality of the LED chips in sequence; and
   a database to record forward voltages of the plurality of LED chips with corresponded coordinates in sequence.

2. The apparatus according to claim 1, wherein each of the plurality of LED chips has a p electrode on one side and an n electrode on the other side.

3. The apparatus according to claim 2, further comprising a sensor to register intensities and wavelengths of the plurality of LED chips with the corresponding coordinates into the database.

4. An apparatus for transferring a plurality of LED chips to a bonding substrate, comprising:
   an apparatus for probing the plurality of LED chips according to claim 3;
   means for expanding a tape with the plurality of LED chips thereon, such that distances among the plurality of LED chips substantially equally to distances among bonding pads on the bonding substrate;
   means for simultaneously hitting the plurality of LED chips, from the tape to the bonding substrate, according to determined forward voltages, intensities, and wavelengths of the database.

5. The apparatus according to claim 1, wherein each of the plurality of LED chips has a p electrode and an n electrode on the same side.

6. The apparatus according to claim 5, further comprising a sensor to register intensities and wavelengths of the plurality of LED chips with the corresponding coordinates into the database.

7. An apparatus for transferring a plurality of LED chips to a bonding substrate, comprising:
   an apparatus for probing the plurality of LED chips according to claim 6;
   means for expanding a tape with the plurality of LED chips thereon, such that distances among the plurality of LED chips substantially equally to distances among bonding pads on the bonding substrate;
   means for simultaneously hitting the plurality of LED chips, from the tape to the bonding substrate, according to determined forward voltages, intensities, and wavelengths of the database.

8. An apparatus for transferring a plurality of LED chips to a bonding substrate, comprising:
   an apparatus for probing the plurality of LED chips according to claim 1;
   means for expanding a tape with the plurality of LED chips thereon, such that distances among the plurality of LED chips substantially equally to distances among bonding pads on the bonding substrate;
   means for simultaneously hitting the plurality of LED chips, from the tape to the bonding substrate, according to determined forward voltages of the database.

* * * * *